United States Patent
Sugizaki et al.

(10) Patent No.: US 10,171,750 B2
(45) Date of Patent: Jan. 1, 2019

(54) SOLID-STATE IMAGE SENSOR, IMAGING CONTROL METHOD, SIGNAL PROCESSING METHOD, AND ELECTRONIC APPARATUS

(71) Applicant: SONY CORPORATION, Tokyo (JP)

(72) Inventors: Taro Sugizaki, Kanagawa (JP); Go Yamanaka, Kanagawa (JP); Daisuke Yoshioka, Kanagawa (JP); Toru Nishi, Kanagawa (JP); Yousuke Horie, Fukuoka (JP); Takesi Kozasa, Fukuoka (JP); Keneki Go, Kanagawa (JP); Norihiro Ichimaru, Kanagawa (JP); Naoki Hosoi, Kanagawa (JP)

(73) Assignee: SONY CORPORATION, Tokyo (JP)

( * ) Notice: Subject to any disclaimer, the term of this patent is extended or adjusted under 35 U.S.C. 154(b) by 0 days.

(21) Appl. No.: 15/326,259

(22) PCT Filed: Jul. 10, 2015

(86) PCT No.: PCT/JP2015/069829
§ 371 (c)(1),
(2) Date: Jan. 13, 2017

(87) PCT Pub. No.: WO2016/013412
PCT Pub. Date: Jan. 28, 2016

(65) Prior Publication Data
US 2017/0201693 A1   Jul. 13, 2017

(30) Foreign Application Priority Data

Jul. 25, 2014   (JP) .................................. 2014-151702

(51) Int. Cl.
*H04N 5/243*   (2006.01)
*H04N 5/355*   (2011.01)
(Continued)

(52) U.S. Cl.
CPC ....... *H04N 5/243* (2013.01); *H01L 27/14605* (2013.01); *H01L 27/14612* (2013.01);
(Continued)

(58) Field of Classification Search
CPC .... H04N 5/243; H04N 5/2351; H04N 5/3535; H04N 5/355; H04N 5/357; H04N 5/3696;
(Continued)

(56) References Cited

U.S. PATENT DOCUMENTS

2007/0076269 A1* 4/2007 Kido .................. H04N 5/23245
358/474
2012/0169909 A1   7/2012 Kaneo et al.

FOREIGN PATENT DOCUMENTS

CN   102668544 A   9/2012
EP   2482544 A1    8/2012
(Continued)

OTHER PUBLICATIONS

International Search Report and Written Opinion of PCT Application No. PCT/JP2015/069829, dated Sep. 29, 2015, 5 pages of English Translation and 6 pages of ISRWO.
(Continued)

*Primary Examiner* — Twyler Haskins
*Assistant Examiner* — Fayez Bhuiyan
(74) *Attorney, Agent, or Firm* — Chip Law Group

(57) ABSTRACT

The present technology relates to a solid-state image sensor, an imaging control method, a signal processing method, and an electronic apparatus that suppress the deterioration of image quality, which is caused by the difference of sensitivity between pixels. A solid-state image sensor includes: a pixel array unit including a plurality of pixels arranged, the plurality of pixels including a plurality of kinds of pixels, the plurality of kinds of pixels including a first pixel and a second pixel, the first pixel having the highest sensitivity, the (Continued)

second pixel having a sensitivity lower than the sensitivity of the first pixel; and a control unit that controls at least one of an analog gain and exposure time of/for the respective pixels depending on a ratio between the sensitivities of the first pixel and the second pixel. The present technology is applicable to a solid-state image sensor such as a CMOS image sensor.

36 Claims, 28 Drawing Sheets

(51) Int. Cl.
    *H04N 5/357*      (2011.01)
    *H01L 27/146*      (2006.01)
    *H04N 5/235*      (2006.01)
    *H04N 5/353*      (2011.01)
    *H04N 5/369*      (2011.01)
    *H04N 5/378*      (2011.01)
    *H04N 9/04*      (2006.01)
    *H04N 9/07*      (2006.01)

(52) U.S. Cl.
    CPC .. *H01L 27/14621* (2013.01); *H01L 27/14645* (2013.01); *H04N 5/2351* (2013.01); *H04N 5/2352* (2013.01); *H04N 5/355* (2013.01); *H04N 5/357* (2013.01); *H04N 5/3535* (2013.01); *H04N 5/35563* (2013.01); *H04N 5/3696* (2013.01); *H04N 5/378* (2013.01); *H04N 9/045* (2013.01); *H04N 9/07* (2013.01); *H04N 2209/048* (2013.01)

(58) Field of Classification Search
    CPC .. H04N 5/378; H04N 9/045; H04N 2209/048; H01L 27/14605; H01L 27/14612; H01L 27/14621; H01L 27/14645
    See application file for complete search history.

(56) References Cited

FOREIGN PATENT DOCUMENTS

| | | |
|---|---|---|
| JP | 2002-290980 A | 10/2002 |
| JP | 2007-208885 A | 8/2007 |
| JP | 2011-071647 A | 4/2011 |
| KR | 10-2012-0069694 A | 6/2012 |
| WO | 2011/037048 A1 | 3/2011 |

OTHER PUBLICATIONS

International Preliminary Report on Patentability of PCT Application No. PCT/JP2015/069829, dated Feb. 9, 2017, 6 pages of English Translation and 3 pages of IPRP.

* cited by examiner

| Light source | Color temperature (K) | W/G sensitivity ratio (x) | W/G sensitivity ratio (dB) |
|---|---|---|---|
| A | 2950 | 1.89 | 5.5 |
| Fluorescent light | 4300 | 1.81 | 5.2 |
| D70 | 7400 | 2.0 | 6.0 |

SOLID-STATE IMAGE SENSOR, IMAGING CONTROL METHOD, SIGNAL PROCESSING METHOD, AND ELECTRONIC APPARATUS

CROSS REFERENCE TO RELATED APPLICATIONS

This application is a U.S. National Phase of International Patent Application No. PCT/JP2015/069829 filed on Jul. 10, 2015, which claims priority benefit of Japanese Patent Application No. JP 2014-151702 filed in the Japan Patent Office on Jul. 25, 2014. Each of the above-referenced applications is hereby incorporated herein by reference in its entirety.

TECHNICAL FIELD

The present technology relates to a solid-state image sensor, an imaging control method, a signal processing method, and an electronic apparatus, and particularly to a solid-state image sensor, an imaging control method, a signal processing method, and an electronic apparatus that suppress the deterioration of image quality, which is caused by the difference of sensitivity between pixels.

BACKGROUND ART

Improving the sensitivity of an image sensor by using a white pixel (referred to also as clear pixel), which is a pixel using a colorless filter or a pixel using no color filter has been proposed (see, for example, Patent Literature 1).

CITATION LIST

Patent Literature

Patent Literature 1: Japanese Patent Application Laid-open No. 2010-136225

DISCLOSURE OF INVENTION

Technical Problem

However, because the white pixel has a higher sensitivity than another pixel, it is saturated faster than another pixel. As a result, a saturation false color called purple fringing is generated, thereby deteriorating the image quality.

In view of the above, the present technology has been made to suppress the deterioration of image quality, which is caused by the difference of sensitivity between pixels.

Solution to Problem

A solid-state image sensor according to a first aspect of the present technology includes: a pixel array unit including a plurality of pixels arranged, the plurality of pixels including a plurality of kinds of pixels, the plurality of kinds of pixels including a first pixel and a second pixel, the first pixel having the highest sensitivity, the second pixel having a sensitivity lower than the sensitivity of the first pixel; and a control unit that controls at least one of an analog gain and exposure time of/for the respective pixels depending on a ratio between the sensitivities of the first pixel and the second pixel.

The control unit may correct a difference between the sensitivities of the first pixel and the second pixel by generating a gain difference between a first analog gain of the first pixel and a second analog gain of the second pixel and providing a time difference between exposure time for the first pixel and exposure time for the second pixel when an amount of incident light has a value equal to or larger than a predetermined threshold value.

The control unit may set a minimum value of the second analog gain to a value higher than a minimum value of the first analog gain by a second offset value smaller than a first offset value corresponding to the sensitivity ratio, and make the exposure time for the first pixel shorter than the exposure time for the second pixel depending on an amount corresponding to a difference between the gain difference and the first offset value when the gain difference is smaller than the first offset value.

The control unit may adjust the first offset value and the second offset value depending on a change in the sensitivity ratio caused due to a change in a light source or a color temperature.

The control unit may set the first analog gain to a value lower than the second analog gain by the first offset value when the amount of incident light is less than the threshold value.

The control unit may set the first analog gain and the second analog gain with a slope of a reference signal used for AD conversion of a pixel signal of the first pixel and a pixel signal of the second pixel, and cause a dynamic range of a DA conversion unit that outputs the reference signal to match with a signal level when charges are stored in a photoelectric conversion element of the first pixel, the charges having the number of saturated electrons.

The control unit may change at least one of an analog gain and exposure time of/for the respective pixels depending on a change in the sensitivity ratio caused due to a change in a light source or a color temperature.

The first pixel may be a white pixel, and the second pixel may be a pixel of a color different from that of the white pixel.

The second pixel may include a red pixel and a blue pixel, and the sensitivity ratio may be a ratio of a sensitivity of the white pixel to a sensitivity of a green pixel calculated from the white pixel, the red pixel, and the blue pixel.

The first pixel may be a pixel used for mainly a brightness signal, and the second pixel may be a pixel used for mainly a color signal.

The second pixel may be a pixel having the second highest sensitivity.

An imaging control method according to the first aspect of the present technology includes: controlling, by a solid-state image sensor including a pixel array unit including a plurality of pixels arranged, the plurality of pixels including a plurality of kinds of pixels, the plurality of kinds of pixels including a first pixel and a second pixel, the first pixel having the highest sensitivity, the second pixel having a sensitivity lower than the sensitivity of the first pixel, at least one of an analog gain and exposure time of/for the respective pixels depending on a ratio between the sensitivities of the first pixel and the second pixel.

An electronic apparatus according to the first aspect of the present technology includes: a solid-state image sensor including a pixel array unit including a plurality of pixels arranged, the plurality of pixels including a plurality of kinds of pixels, the plurality of kinds of pixels including a first pixel and a second pixel, the first pixel having the highest sensitivity, the second pixel having a sensitivity lower than the sensitivity of the first pixel, and a control unit that controls at least one of an analog gain and exposure time of/for the respective pixels depending on a ratio between the sensitivities of the first pixel and the second pixel.

A solid-state image sensor according to a second aspect of the present technology includes: a pixel array unit including a plurality of pixels arranged, the plurality of pixels including a plurality of kinds of pixels, the plurality of kinds of pixels including a first pixel and a second pixel, the first pixel having the highest sensitivity, the second pixel having a sensitivity lower than the sensitivity of the first pixel; and a control unit that shifts potential of a pixel signal of the first pixel by an amount corresponding to a ratio between the sensitivities of the first pixel and the second pixel.

The solid-state image sensor may further include an AD conversion unit that includes a comparator, the comparator including a first input terminal and a second input terminal, the pixel signal being input to the first input terminal, a reference signal being input to the second input terminal, the pixel signal being compared with the reference signal, the comparator comparing the pixel signal with the reference signal, in which the control unit shifts the potential of the pixel signal by changing a coupling ratio on a side of the first input terminal.

The solid-state image sensor may further including: a first capacitor connected to the first input terminal, a predetermined signal for eliminating a potential difference between the first input terminal and the second input terminal being input to the first capacitor; and a second capacitor connected between a predetermined power supply and the first capacitor via a switch, in which the control unit changes the coupling ratio by changing a state of the switch.

The second capacitor may include a plurality of second capacitors and the switch may include a plurality of switches, each of the plurality of second capacitors being connected between the power supply and the first capacitor via the respective switches, and the control unit may change the coupling ratio by individually changing a state of the respective switches.

The control unit may change the potential of the pixel signal by changing conversion efficiency of a charge voltage conversion unit of the first pixel.

The control unit may change the conversion efficiency of the charge voltage conversion unit by changing a capacity of the charge voltage conversion unit.

The control unit may adjust a shift amount of the potential of the pixel signal depending on a change in the sensitivity ratio caused due to a change in a light source or a color temperature.

The first pixel may be a white pixel, and the second pixel may be a pixel of a color different from that of the white pixel.

The second pixel may include a red pixel and a blue pixel, and the sensitivity ratio may be a ratio of a sensitivity of the white pixel to a sensitivity of a green pixel calculated from the white pixel, the red pixel, and the blue pixel.

The first pixel may be a pixel used for mainly a brightness signal, and the second pixel may be a pixel used for mainly a color signal.

The second pixel may be a pixel having the second highest sensitivity.

A signal processing method according to the second aspect of the present technology includes: shifting, by a solid-state image sensor including a pixel array unit including a plurality of pixels arranged, the plurality of pixels including a plurality of kinds of pixels, the plurality of kinds of pixels including a first pixel and a second pixel, the first pixel having the highest sensitivity, the second pixel having a sensitivity lower than the sensitivity of the first pixel, potential of the first pixel by an amount corresponding to a ratio between the sensitivities of the first pixel and the second pixel.

An electronic apparatus according to the second aspect of the present technology includes: a solid-state image sensor including a pixel array unit including a plurality of pixels arranged, the plurality of pixels including a plurality of kinds of pixels, the plurality of kinds of pixels including a first pixel and a second pixel, the first pixel having the highest sensitivity, the second pixel having a sensitivity lower than the sensitivity of the first pixel, and a control unit that controls potential of the first pixel by an amount corresponding to a ratio between the sensitivities of the first pixel and the second pixel.

A solid-state image sensor according to a third aspect of the present technology includes: a pixel array unit including a plurality of pixels arranged, the plurality of pixels including a plurality of kinds of pixels, the plurality of kinds of pixels including a first pixel and a second pixel, the first pixel having the highest sensitivity, the second pixel having a sensitivity lower than the sensitivity of the first pixel; and a control unit that controls an analog gain of the respective pixels depending on an amount of incident light, in which the control unit sets a first analog gain of the first pixel to a value lower than a second analog gain of the second pixel by a first offset value corresponding to a ratio between the sensitivities of the first pixel and the second pixel, and a dynamic range of the first analog gain to be in a range lower than a dynamic range of the second analog gain.

The control unit may shift the dynamic range of the first analog gain in a range lower than the dynamic range of the second analog gain when the analog gain of the second analog gain is less than a predetermined threshold value.

The solid-state image sensor may further include a DA conversion unit that outputs a reference signal used for AD conversion of a pixel signal of a pixel of the pixel array unit, in which the control unit controls the first analog gain and the second analog gain by controlling a slope of the reference signal, and sets the dynamic range of the first analog gain to be in a range lower than the dynamic range of the second analog gain by setting a reference current of the DA conversion unit for the first pixel to be larger than that for the second pixel, the reference current increasing and decreasing voltage of the reference signal.

The control unit may change a set value of the reference current in units of frames.

The control unit may change a set value of the reference current in units of pixels.

The first pixel may be a white pixel, and the second pixel may be a pixel of a color different from that of the white pixel.

The second pixel may include a red pixel and a blue pixel, and the sensitivity ratio may be a ratio of a sensitivity of the white pixel to a sensitivity of a green pixel calculated from the white pixel, the red pixel, and the blue pixel.

The first pixel may be a pixel used for mainly a brightness signal, and the second pixel may be a pixel used for mainly a color signal.

The second pixel may be a pixel having the second highest sensitivity.

An imaging control method according to the third aspect of the present technology includes: controlling, by a solid-state image sensor including a pixel array unit including a plurality of pixels arranged, the plurality of pixels including a plurality of kinds of pixels, the plurality of kinds of pixels including a first pixel and a second pixel, the first pixel having the highest sensitivity, the second pixel having a sensitivity lower than the sensitivity of the first pixel, an analog gain of the respective pixels depending on an amount of incident light; and setting a first analog gain of the first pixel to a value lower than a second analog gain of the second pixel by a first offset value corresponding to a ratio between the sensitivities of the first pixel and the second pixel, and a dynamic range of the first analog gain to be in a range lower than a dynamic range of the second analog gain.

An electronic apparatus according to the third aspect of the present technology includes: a solid-state image sensor including a pixel array unit including a plurality of pixels arranged, the plurality of pixels including a plurality of kinds of pixels, the plurality of kinds of pixels including a first pixel and a second pixel, the first pixel having the highest sensitivity, the second pixel having a sensitivity lower than the sensitivity of the first pixel, and a control unit that controls an analog gain of the respective pixels depending on an amount of incident light, in which the control unit sets a first analog gain of the first pixel to a value lower than a second analog gain of the second pixel by a first offset value corresponding to a ratio between the sensitivities of the first pixel and the second pixel, and a dynamic range of the first analog gain to be in a range lower than a dynamic range of the second analog gain.

In the first aspect of the present technology, at least one of an analog gain and exposure time of/for the respective pixels is controlled depending on a ratio between the sensitivities of the first pixel and the second pixel.

In the second aspect of the present technology, potential of a pixel signal of the first pixel is shifted by an amount corresponding to a ratio between the sensitivities of the first pixel and the second pixel.

In the third aspect of the present technology, a first analog gain of the first pixel is set to a value lower than a second analog gain of the second pixel by a first offset value corresponding to a ratio between the sensitivities of the first pixel and the second pixel, and a dynamic range of the first analog gain is set to be in a range lower than a dynamic range of the second analog gain.

Advantageous Effects of Invention

In accordance with the first to third aspect of the present technology, it is possible to suppress the deterioration of image quality, which is caused by the difference of sensitivity between pixels.

MODE(S) FOR CARRYING OUT THE INVENTION

Figure 1:
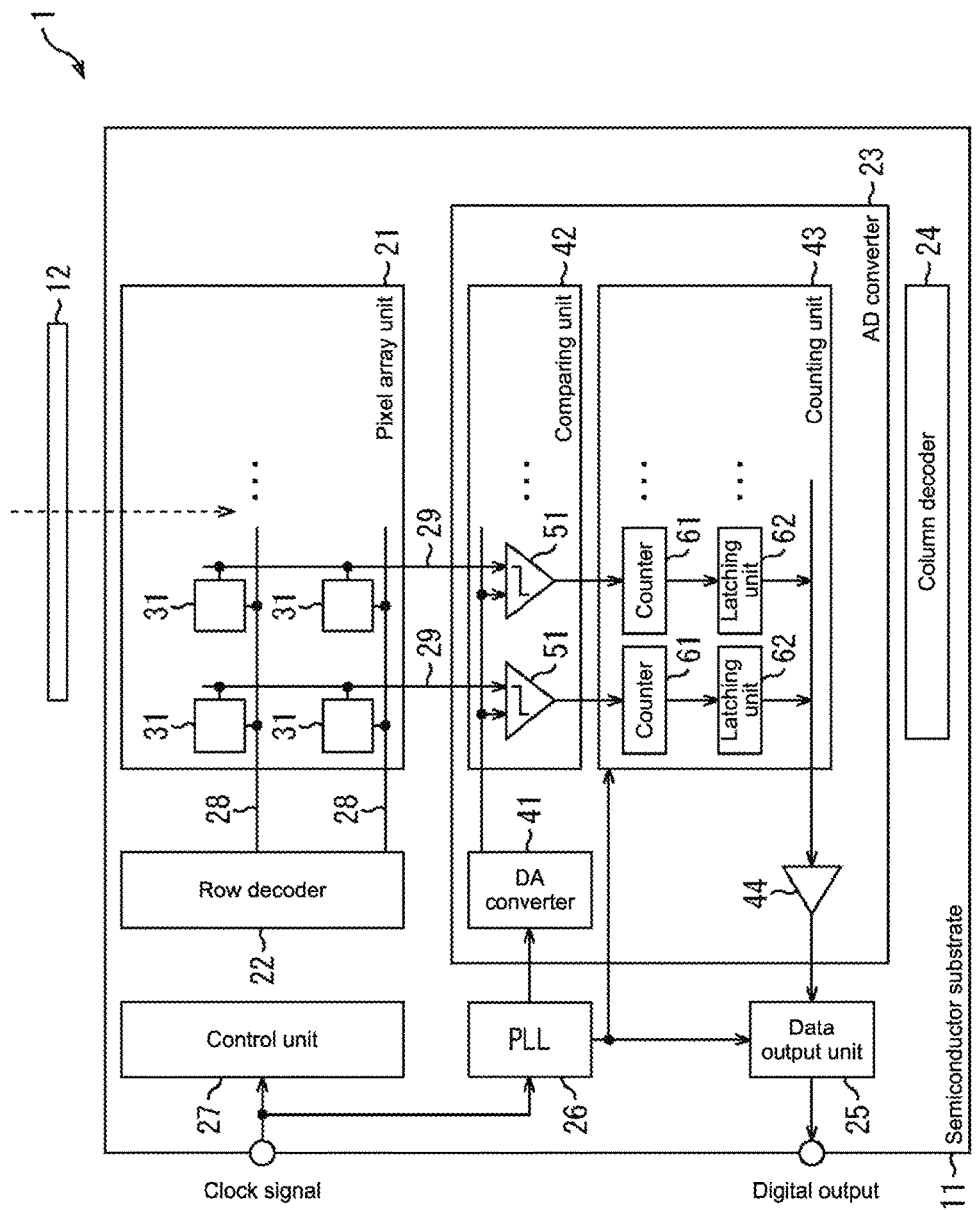
FIG. 1 A system configuration diagram showing the schematic configuration of a solid-state image sensor to which the present technology is applied.

Hereinafter, embodiments for carrying out the present technology (hereinafter, referred to as embodiments) will be described. Note that descriptions will be made in the following order.
1. Embodiments
2. Modified Examples
3. Electronic Apparatus
  <1. Embodiments>
  {Configuration Example of Solid-state Image Sensor 1}
  FIG. 1 is a system configuration diagram showing the schematic configuration of a solid-state image sensor 1 according to an embodiment of the present technology. Note that although the case where the solid-state image sensor 1 is a CMOS image sensor, which is a kind of an X-Y address type solid-state image sensor, will be described here as an example, the present technology is not necessarily need to be applied to the CMOS image sensor.

The solid-state image sensor 1 includes a pixel array unit 21 formed on a semiconductor substrate 11, and a peripheral circuit unit integrated on the same semiconductor substrate 11 as that of the pixel array unit 21. The peripheral circuit unit includes, for example, a row decoder 22, an AD converter 23 (hereinafter, referred to as ADC 23), a column decoder 24, a data output unit 25, a PLL circuit 26, and a control unit 27.

Note that, for example, the solid-state image sensor 1 may have a laminated structure in which the pixel array unit 21 and the peripheral circuit unit are formed on different substrates, and a plurality of substrates are laminated. Further, as the solid-state image sensor 1, any of a front-surface irradiation type image sensor and a rear-surface irradiation type image sensor can be employed.

In the pixel array unit 21, unit pixels 31 (hereinafter, referred to also simply as pixels 31), each of which includes a photoelectric conversion element that photoelectrically converts incident light into the amount of charge depending on the amount of incident light, are two-dimensionally arranged in a matrix pattern.

Further, in the pixel array unit 21, for the matrix-shaped pixel arrangement, a pixel drive line 28 is placed for each row along the right-left direction of the figure (pixel arrangement direction of the pixel rows/horizontal direction), and a vertical signal line 29 is formed for each column along the up-down direction of the figure (pixel arrangement direction of the pixel columns/vertical direction). One end of the pixel drive line 28 is connected to an output end of the row decoder 22, which corresponds to the respective rows. Note that although one pixel drive line 28 is shown for one line in FIG. 1, the pixel drive line 28 includes a plurality of lines for one row as will be described later with reference to FIG. 2.

Figure 2:
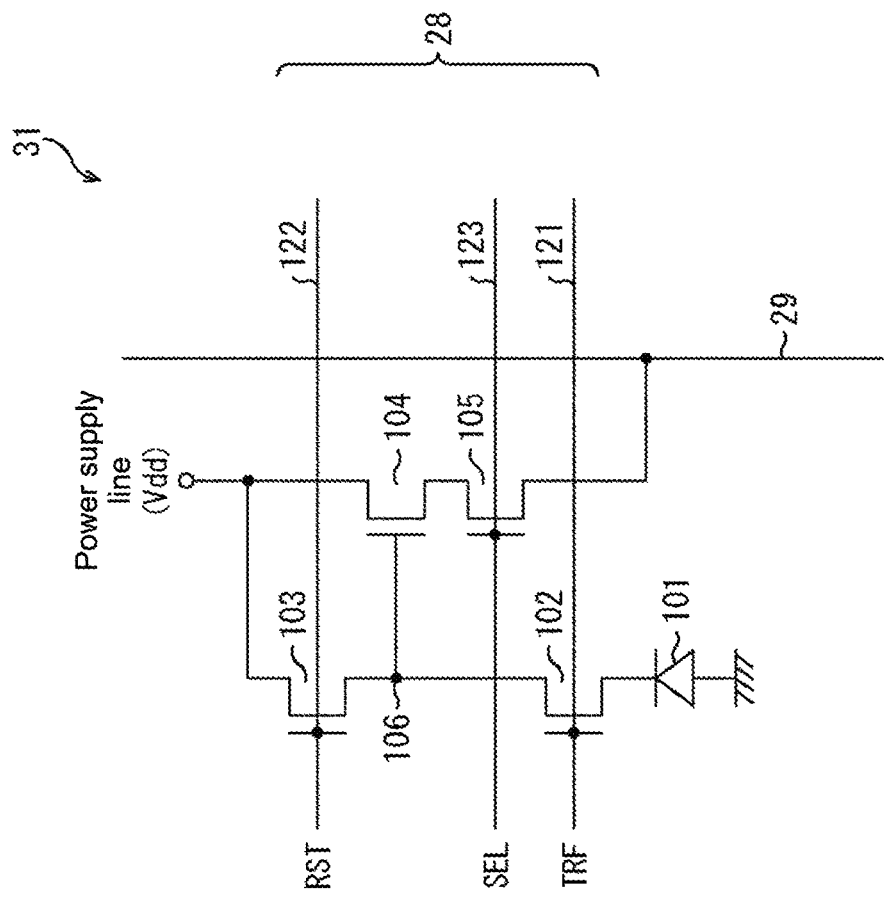
FIG. 2 A diagram showing an example of a circuit configuration of a unit pixel.

Now, with reference to FIG. 2, an example of the circuit configuration of the unit pixel 31 will be described.

The unit pixel 31 includes, for example, a photodiode 101 as the photoelectric conversion element. Further, the unit pixel 31 includes, for example, four transistors of a transfer transistor (transfer gate) 102, a reset transistor 103, an amplification transistor 104, and a selection transistor 105 in addition to the photodiode 101.

Here, as the four transistors 102 to 105, for example, N-channel transistors are used. It should be noted that the combination of conductive types of the transfer transistor 102, the reset transistor 103, the amplification transistor 104, and the selection transistor 105 illustrated here is merely an example, and is not limited thereto. Specifically, a combination including a P-channel transistor can be employed as necessary.

For this unit pixel 31, for example, three drive lines of a transfer line 121, a reset line 122, and a selection line 123 are commonly provided to the pixels in the same pixel row as the pixel drive line 28. One ends of the transfer line 121, the reset line 122, and the selection line 123 are connected to an output end of the row decoder 22, which corresponds to the respective pixel rows, in units of pixel rows.

Then, for the unit pixel 31, a transfer signal TRF, which is a drive signal that drives the unit pixel 31, a reset signal RST, and a selection signal SEL are appropriately supplied from the row decoder 22. Specifically, the transfer signal TRF, the reset signal RST, and the selection signal SEL are respectively applied to the gate electrode of the transfer transistor 102, the gate electrode of the reset transistor 103, and the gate electrode of the selection signal SEL.

The anode electrode of the photodiode 101 is connected to the low potential side power supply (e.g., ground), photoelectrically converts received light (incident light) into photocharges (here, photoelectrons) having the amount of charge corresponding to the amount of light, and stores the photocharges. The cathode electrode of the photodiode 101 is electrically connected to the gate electrode of the amplification transistor 104 via the transfer transistor 102. A node 106 electrically connected to the gate electrode of the amplification transistor 104 is referred to as an FD (floating diffusion/floating diffusion area) unit.

The transfer transistor 102 is connected between the cathode electrode of the photodiode 101 and the FD unit 106. To the gate electrode of the transfer transistor 102, the transfer signal TRF of a high level (e.g., Vdd level) that is active (hereinafter, referred to as High-active) is supplied from the row decoder 22. In response to this transfer signal TRF, the transfer transistor 102 is made conductive, and transfers the photocharges photoelectrically converted in the photodiode 101 to the FD unit 106.

The drain electrode and the source electrode of the reset transistor 103 are respectively connected to a pixel power supply Vdd and the FD unit 106. To the gate electrode of the reset transistor 103, the High-active reset signal RST is supplied from the row decoder 22. In response to this reset signal RST, the reset transistor 103 is made conductive, and resets the FD unit 106 by dumping charges of the FD unit 106 in the pixel power supply Vdd.

The gate electrode and the drain electrode of the amplification transistor 104 are respectively connected to the FD unit 106 and the pixel power supply Vdd. Then, the amplification transistor 104 outputs a pixel signal of a reset level Vrst that represents the potential of the FD unit 106 reset by the reset transistor 103. Further, the amplification transistor 104 outputs a pixel signal of a signal level Vsig that represents the potential of the FD unit 106 after the signal charges are transferred by the transfer transistor 102.

The drain electrode and the source electrode of the selection transistor 105 are respectively connected to the source electrode of the amplification transistor 104 and the vertical signal line 29, for example. To the gate electrode of the selection transistor 105, the High-active selection signal SEL is supplied from the row decoder 22. In response to this selection signal SEL, the selection transistor 105 is made conductive, makes the unit pixel 31 in the selected state, and reads a signal output from the amplification transistor 104 to the vertical signal line 29.

Then, from the unit pixel 31, the potential of the reset FD unit 106 and then the potential of the FD unit 106 after the signal charges are transferred are respectively read to the vertical signal line 29 as the reset level Vrst and the signal level Vsig. By the way, the signal level Vsig includes also a component of the reset level Vrst.

Note that although the circuit configuration in which the selection transistor 105 is connected between the source electrode of the amplification transistor 104 and the vertical signal line 29 has been employed here, a circuit configuration in which the selection transistor 105 is connected between the pixel power supply Vdd and the drain electrode of the amplification transistor 104 may be employed.

Further, the unit pixel 31 does not necessarily need to have the pixel configuration including the four transistors. For example, a pixel configuration including three transistors in which the amplification transistor 104 has the function of the selection transistor 105, or a pixel configuration in which a plurality of photoelectric conversion elements (pixels) share the FD unit 106 and the subsequent transistors may be employed regardless of the configuration of the pixel circuit.

Returning to FIG. 1, on the side of the light-receiving surface (light incident surface) of the pixel array unit 21, a color filter array 12 is provided. The color coding of the color filter array 12 is, for example, color coding of the color arrangement where a color as the main component of a brightness signal is placed in a checkered pattern, and a plurality of colors as color information components are arranged in the remaining part. Note that examples of the color as the main component of a brightness signal include a white color (W), a green color (G), and a brightness spectrum.

For example, in the case where W filters are arranged in a checkered pattern as a color as the main component of a brightness signal, filters of the plurality of colors as color information components arranged in the remaining part are, for example, red (R)/green (G)/blue (B) filters. On the other hand, in the case where G filters are arranged in a checkered pattern as a color as the main component of a brightness signal, filters of the plurality of colors as color information components arranged in the remaining part are, for example, R/B filters.

Note that because the sensitivity of the W filter is approximately twice as high as that of the G filter, also the sensitivity of the unit pixel 31 (W pixel) corresponding to the W filter is approximately twice as high as that of the unit pixel 31 (G pixel) corresponding to the G filter. Specifically, for the same amount of incident light, the output current of the photodiode 101 of the W pixel is approximately twice as high as that of the photodiode 101 of the G pixel, and also the signal level Vsig of the W pixel is approximately twice as high as that of the G pixel. By providing the W pixel, the high SN ratio can be achieved.

Figure 3:
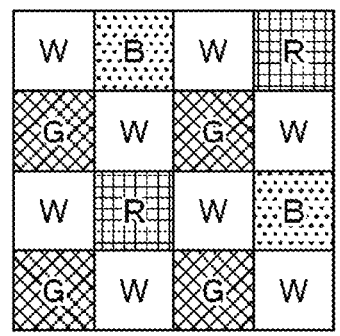
FIG. 3 A color arrangement diagram showing an example of color coding of a color filter array.

FIG. 3 is a color arrangement diagram showing an example of color coding of the color filter array 12. In this example, an example of color coding in which a pattern including four vertical pixels x four horizontal pixels is used as one unit is shown. In this example, similarly to the above-mentioned example of FIG. 3, the W filters, the R filters, the G filters, and the B filters are arranged in the ratio of 8:2:4:2. Specifically, the W filters are arranged in a checkered pattern. The R filters are arranged in the first row, fourth column and in the third row, second column. The B filters are arranged in the first row, second column and in the third row, fourth column. The G filters are arranged at the remaining pixel positions. This pattern of the color filters is repeatedly arranged in the vertical direction and horizontal direction on the color filter array 12.

Note that the R pixel, the G pixel, and the B pixel other than the W pixel will be collectively referred to also as RGB pixel in the following. Further, another example of the color coding of the color filter array 12 will be described later.

Returning to FIG. 1, the row decoder 22 includes a shift register, an address decoder, and the like. Although illustration of the specific configuration is omitted here, the row decoder 22 includes a read scanning system and a sweep scanning system. The read scanning system sequentially performs selection scanning row by row on the unit pixels 31 that read a signal.

On the other hand, the sweep scanning system performs sweep scanning that sweeps unnecessary charges from (resets) the photoelectric conversion element of the unit pixels 31 in the reading row on which the read scanning system performs the reading scanning, prior to the read scanning by the time of shutter speed. The sweep scanning system sweeps (resets) the unnecessary charges, thereby performing a so-called electron shutter operation. Note that the electron shutter operation represents an operation in which the photocharges of the photoelectric conversion element are dumped, and exposure is newly started (storing of photocharges is started).

The signal read by the reading operation performed by the read scanning system corresponds to the amount of light that has entered after the previous reading operation or electron shutter operation. Then, the time from the reading timing of the previous reading operation or the sweeping timing of the previous electron shutter operation to the reading timing of the present reading operation is the photocharge storing time in the unit pixel (exposure time).

The signal output from each unit pixel in the pixel row that has been selectively scanned by the row decoder 22 is supplied to the ADC 23 through the respective vertical signal lines 29. The ADC 23 performs signal processing set in advance on the analog pixel signal output from each pixel in the selected row, for each pixel column of the pixel array unit 21.

Specifically, the ADC 23 performs AD conversion processing that digitizes the analog pixel signal. The ADC 23 is configured to include a DA converter 41 (hereinafter, referred to as DAC 41), a comparing unit 42, a counting unit 43, and a sense amplifier 44. In the comparing unit 42, a comparator 51 is provided for each pixel column of the pixel array unit 21. In the counting unit 43, a counter 61 and a latching unit 62 are provided for each pixel column of the pixel array unit 21.

The DAC 41 generates a reference signal Vref used for AD conversion, and supplies it to each comparator 51. This reference signal Vref is, for example, a signal with a so-called RAMP waveform (inclined waveform) whose voltage value is changed with a predetermined width in a staircase pattern with time. Note that in FIG. 4 or the like which will be described later, the reference signal Vref is represented not by a staircase waveform but by an inclined waveform to simplify the figure.

The comparator 51 compares an analog pixel signal Vvsl read from the unit pixel 31 through the vertical signal line 29 as a comparison input with the reference signal Vref of a RAMP wave supplied from the DAC 41 as a reference input.

As the counter 61, for example, an up/down counter is used. To the counter 61, a clock signal is supplied from the PLL circuit 26 at the same timing as the timing at which supplying of the reference signal Vref to the comparator 51 is started. The counter 61 measures the period of the pulse width of the output pulse of the comparator 51 by performing down-counting or up-counting in synchronization with the clock signal.

The latching unit 62 holds the count value supplied from the counter 61, and supplies a signal representing the held count value to the sense amplifier 44 via, for example, a horizontal transfer line with a k bit width at a predetermined timing.

The sense amplifier 44 amplifies the voltage of the signal representing the count value supplied from the latching unit 62, and supplies it to the data output unit 25.

Figure 4:
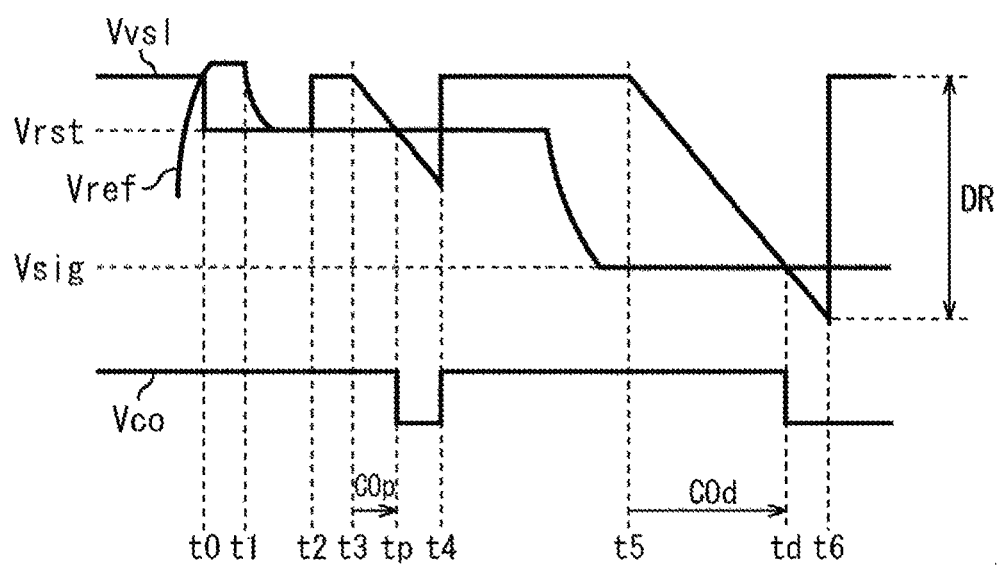
FIG. 4 A diagram for simply describing a basic AD conversion operation.

Now, with reference to FIG. 4, the basic AD conversion operation performed by the ADC 23 will be simply described. Note that the AD conversion operation shown in the figure is repeatedly performed while the pixel signals of the plurality of unit pixels 31 are sequentially read.

The period from a time t0 to a time t1 is a reset period, and the reset operation of the target unit pixel 31 is performed. Accordingly, the pixel signal Vvsl input from the target unit pixel 31 to the comparator 51 is set to the reset level Vrst.

The period from the time t1 to a time t2 is an auto-zero period, and an auto-zero operation is performed. Specifically, an auto-zero signal of a predetermined reference potential is input to both input terminals of the comparator 51, and the potential difference between the input terminals of the comparator 51 is eliminated.

The period from the time t2 to a time t4 is an processing period on the P-phase (Pre-Charge phase). Among them, the period from the time t2 to the time t3 is a P-phase preparation period, and the period from the time t3 to the time t4 is a P-phase reading period.

In the P-phase preparation period, an AD conversion operation such as an operation of returning the reference signal Vref to an initial value is prepared.

Then, at the time t3, inputting of the reference signal Vref from the DAC 41 to the comparator 51 is started, and the P-phase reading period is started. The reference signal Vref is reduced from an initial value with a predetermined width in a staircase pattern with time in the period from the time t3 to the time t4 with a predetermined reference value as the initial value.

The comparator 51 outputs a comparison signal Vco depending on the magnitude relationship between the reference signal Vref and the pixel signal Vvsl, and supplies it to the counter 61. For example, the comparison signal Vco becomes a high level in the case where the reference signal Vref is not less than the pixel signal Vvsl, and a low level in the case where the reference signal Vref is less than the pixel signal Vvsl.

The counter 61 performs, for example, down-counting in the period when the comparison signal Vco is a high level, i.e., the reference signal Vref is not less than the reset level Vrst of the pixel signal Vvsl. Then, the counter 61 stops the down-counting in the period when the comparison signal Vco is a low level, i.e., the reference signal Vref is less than the reset level Vrst of the pixel signal Vvsl.

Therefore, the counter 61 counts the period from when the P-phase reading period is started at the time t3 to when the reference signal Vref falls below the reset level Vrst at a time tp. This count value COp is a digital value corresponding to the charges stored in the reset unit pixel 31.

The period from the time t4 to a time t6 is a processing period on the D-phase (Data-phase). Among them, the period from the time t4 to the time t5 is a D-phase preparation period, and the period from the time t5 to the time t6 is a D-phase reading period.

In the D-phase preparation period, an AD conversion operation such as an operation of returning the reference signal Vref to an initial value is prepared. Further, in the D-phase preparation period, outputting of the pixel signal Vvsl of the signal level Vsig depending on the amount of charge stored in the FD unit 106 from the target unit pixel 31 is started.

Then, at the time t5, inputting of the reference signal Vref from the DAC 41 to the comparator 51 is started, and the D-phase reading period is started. The reference signal Vref is reduced from an initial value with a predetermined width in a staircase pattern with time in the period from the time t5 to the time t6 with a predetermined reference value as the initial value, similarly to the case of the P-phase reading period.

The counter 61 performs, for example, up-counting in the period when the comparison signal Vco output from the comparator 51 is a high-level, i.e., the reference signal Vref is not less than the signal level Vsig of the pixel signal Vvsl. Then, the counter 61 stops the up-counting in the period when the comparison signal Vco is a low-level, i.e., the reference signal Vref is less than the signal level Vsig of the pixel signal Vvsl.

Accordingly, the counter 61 counts the period from when the D-phase reading period is started at the time t5 to when the reference signal Vref falls below the signal level Vsig at a time td. This count value COd is a digital value corresponding to the charges stored in the FD unit 106 of the target unit pixel 31.

Further, the counter 61 performs counting with the counting result of the P-phase reading period as an initial value in the D-phase reading period. Accordingly, the count value held by the counter 61 at the time when the D-phase reading period is finished is a value obtained by subtracting the count value COp from the count value COd. Specifically, the count value held by the counter 61 is a digital value corresponding to the voltage obtained by subtracting the reset level Vrst from the signal level Vsig depending on the charges generated by the photodiode 101 of the target unit pixel 31 depending on the amount of received light. Therefore, the count value held by the counter 61 is a value from which a fixed noise component unique to the pixel such as reset noise of the unit pixel 31 and discrepancy in threshold value of the amplification transistor 104 is removed by so-called correlated double sampling.

Then, the count value held by the counter 61 is transferred to the latching unit 62 under the control of the column decoder 24, and output to the data output unit 25 via the sense amplifier 44 when, for example, the next AD conversion operation is being performed.

Note that the analog gain to the pixel signal Vvsl is controlled by the slope of the reference signal Vref supplied from the DAC 41 to the comparator 51. Specifically, for example, for the same signal level Vsig, the count value COd is increased as the slope of the reference signal Vref gets lower, and the count value COd is decreased as the slope of the reference signal Vref gets higher. Therefore, the analog gain to the pixel signal Vvsl gets higher as the slope of the reference signal Vref gets lower, and gets lower as the slope of the reference signal Vref gets higher.

Further, the dynamic range of the DAC 41 is defined by a change width DR of the reference signal Vref in the D-phase reading period. Therefore, the dynamic range of the DAC 41 is decreased as the analog gain is larger and the slope of the reference signal Vref gets lower. On the other hand, the dynamic range of the DAC 41 is increased as the analog gain is smaller and the slope of the reference signal Vref gets higher.

Note that the dynamic range of the DAC 41 will be referred to also as the dynamic range of the reference signal Vref in the following.

Returning to FIG. 1, the column decoder 24 includes, a shift register, an address decoder, and the like, and selectively scans the circuit part corresponding to the pixel column of the ADC 23 in order. By the selective scanning performed by the column decoder 24, the pixel signal on which signal processing has been performed by the ADC 23 for each pixel column is output in order.

Note that the comparator 51, the counter 61, and the latching unit 62 in each pixel column may operate in parallel under the control of the column decoder 24, or may operate individually. Therefore, it is possible to perform the AD conversion operation in parallel with an arbitrary combination of the pixel columns.

The data output unit 25 includes, for example, an interface circuit of LVDS (Low Voltage Differential Signaling). The data output unit 25 supplies the output signal representing the count value obtained by digitizing the pixel signal of the unit pixel 31 to a signal processing unit (not shown) formed of ISP (Image Signal Processor), DSP(Digital Signal Processor), or the like.

The signal processing unit performs processing of converting the signal corresponding to the color arrangement of the above-mentioned color filter array (color filter unit) 12, which is output from each pixel in the pixel array unit 21, into a signal that corresponds to a Bayer pattern by calculation processing, for example. At this time, because a color as the main component of a brightness signal is placed in a checkered pattern, the signal of the color as the main component can be used to restore the signal of another color at the upper/lower/left/right positions thereof. Therefore, it is possible to increase the color conversion efficiency at the signal processing unit. Further, because the signal processing unit outputs a signal corresponding to a Bayer pattern, the subsequent signal processing can be performed by using the existing DSP for Bayer pattern, or the like.

Note that a part or whole of this signal processing unit may be provided on the semiconductor substrate 11.

The PLL circuit 26 converts the clock signal supplied from the outside into a clock signal of a predetermined frequency, and supplies it to the DAC 41, the counting unit 43, and the data output unit 25.

The control unit 27 receives a clock signal supplied from the outside, data for commanding an operation mode, and the like, and outputs data such as internal information of this solid-state image sensor 1. The control unit 27 further includes a timing generator that generates various timing signals, and performs drive control on the row decoder 22, the ADC 23, the column decoder 24, the data output unit 25, and the like on the basis of various timing signals generated by the timing generator.

{Configuration Example of DAC 41}

Figure 5:
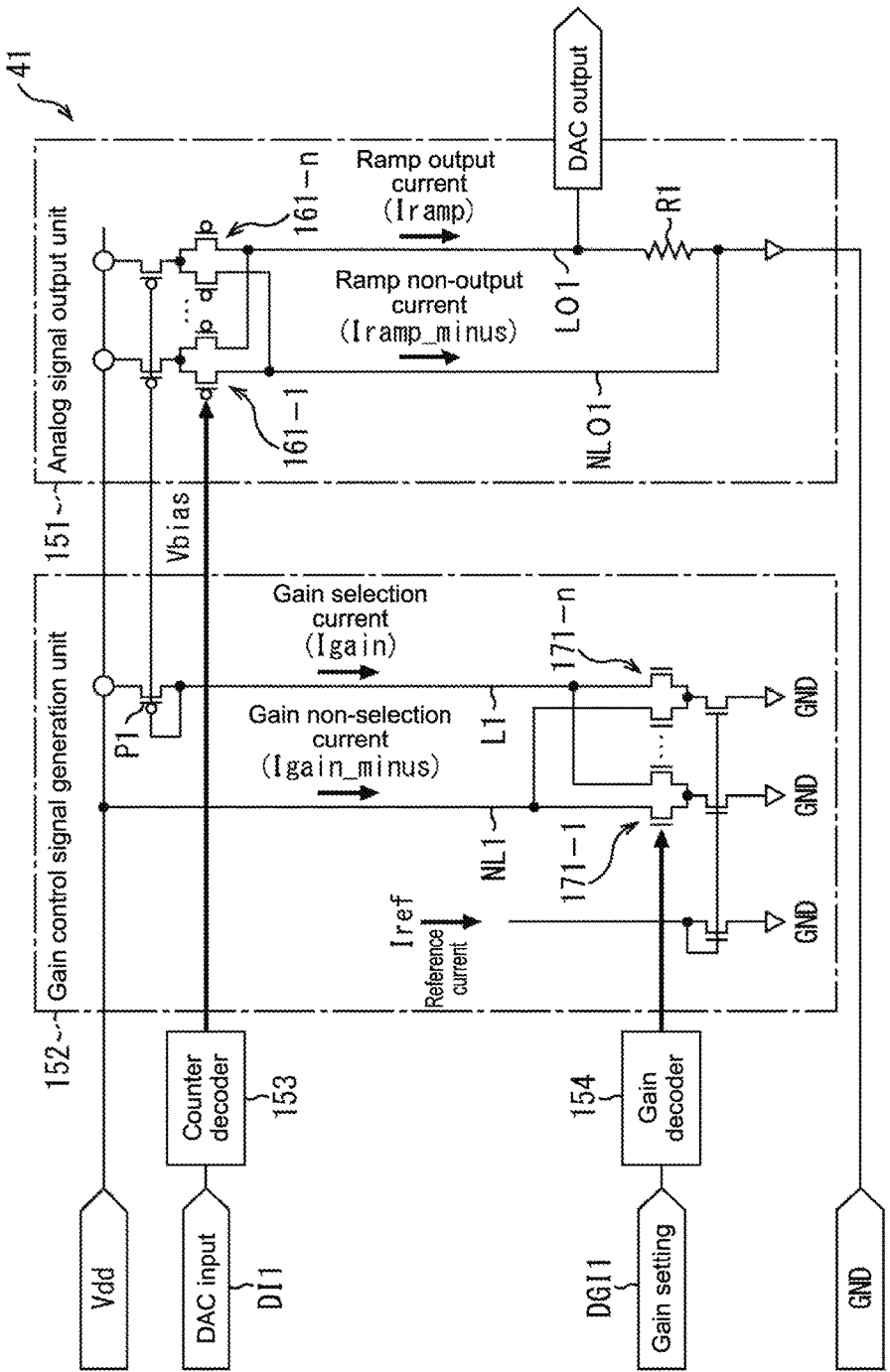
FIG. 5 A circuit diagram showing a specific configuration example of a DA converter.

FIG. 5 is a circuit diagram showing a specific configuration example of the DAC 41.

The DAC 41 is configured to include an analog signal output unit 151, a gain control signal generation unit 152, a counter decoder 153, and a gain decoder 154.

The analog signal output unit 151 generates an analog signal depending on the value of a digital input signal DI1 decoded by the counter decoder 153. The analog signal output unit 151 adjusts the gain of the analog signal generated depending on a bias voltage Vbias as a gain control signal supplied from the gain control signal generation unit 152.

The analog signal output unit 151 includes a plurality of basic current source cells 161-1 to 161-n, each of which includes a differential transistor and a transistor as a current source of this differential transistor. To the gate of the transistor as the current source, common bias voltage is supplied. The basic current source cells 161-1 to 161-n are each formed of, for example, a p-channel MOS (PMOS) transistor.

The analog signal output unit 151 includes a selection output line LO1, a non-selection output line NLO1, and an output resistance R1 as a current voltage conversion circuit (IV conversion circuit).

The drains of some transistors among the differential transistors in the plurality of basic current source cells 161-1 to 161-n are commonly connected to the selection output line LO1, and the drains of other transistors are commonly connected to the non-selection output line NLO1.

The selection output line LO1 is connected to a ground GND via the output resistance R1, and the non-selection output line NLO1 is directly connected to the ground GND.

Some transistors among the differential transistors in the plurality of basic current source cells 161-1 to 161-n are selected depending on the decoding information of the counter decoder 153. Accordingly, the current output of the selected basic current source cell is added, an output current Iramp flows through the selection output line LO1, and this current Iramp is converted into a voltage signal by the output resistance R1 and output.

When the other transistors in the plurality of basic current source cells 161-1 and 161-n are selected depending on the decoding information of the counter decoder 153, the current output of the selected basic current source cell is added, and a non-output current Iramp minus flows to the ground GND via the non-selection output line NLO1.

The gain control signal generation unit 152 generates the bias voltage Vbias as a gain control signal depending on the value of a digital gain control signal DGI1 decoded by the gain decoder 154.

The gain control signal generation unit 152 includes a plurality of basic current source cells 171-1 to 171-n, each of which includes a differential transistor and a transistor as a current source of this differential transistor. To the gate of the transistor as the current source, bias voltage depending on a common reference current Iref is supplied. The basic current source cells 171-1 to 171-n are each formed of, for example, an n-channel MOS (NMOS) transistor.

The gain control signal generation unit 152 includes a selection line L1, a non-selection line NL1, and a diode-connected PMOS transistor P1 as an IV conversion circuit.

The drains of some transistors among the differential transistors in the plurality of basic current source cells 171-1 to 171-n are commonly connected to the selection line L1, and the drains of other transistors are commonly connected to the non-selection line NL1.

The selection line L1 is connected to the drain and gate of the PMOS transistor P1, and the connection node is connected to the gate of each transistor as the current source of the basic current source cells 161-1 to 161-n in the analog signal output unit 151. Specifically, the PMOS transistor P1 and each transistor as the current source of the basic current source cells 161-1 to 161-n constitute a current mirror circuit.

The non-selection line NL1 is directly connected to a power supply Vdd.

Some transistors among the differential transistors in the plurality of basic current source cells 171-1 to 171-n are selected depending on the decoding information of the gain decoder 154. Accordingly, the current output of the selected basic current source cell is added, a gain current Igain flows through the selection line L1, and this gain current Igain is converted into a voltage signal by the PMOS transistor P1 and output to the analog signal output unit 151.

When the other transistors in the plurality of basic current source cells 171-1 to 171-n are selected depending on the decoding information of the gain decoder 154, the current output of the selected basic current source cell is added, and a non-selection side current Igain_minus flows to the power supply Vdd through the non-selection line NL1.

Note that the output voltage of the DAC 41 is increased or decreased in proportion to the reference current Iref of the gain control signal generation unit 152. Specifically, the output voltage of the DAC 41 is doubled when the reference current Iref is doubled, and the output voltage of the DAC 41 is halved when the reference current Iref is halved. Therefore, when the reference current Iref is doubled, the slope of the reference signal Vref is −2 times the original, and the analog gain is doubled. On the other hand, when the reference current Iref is halved, the slope of the reference signal Vref is −½ times the original, and the analog gain is halved.

Note that the adjustment of the reference current Iref is performed by using a variable resistance or the like (not shown).

(Configuration Example of Function of Control Unit 27)

Figure 6:
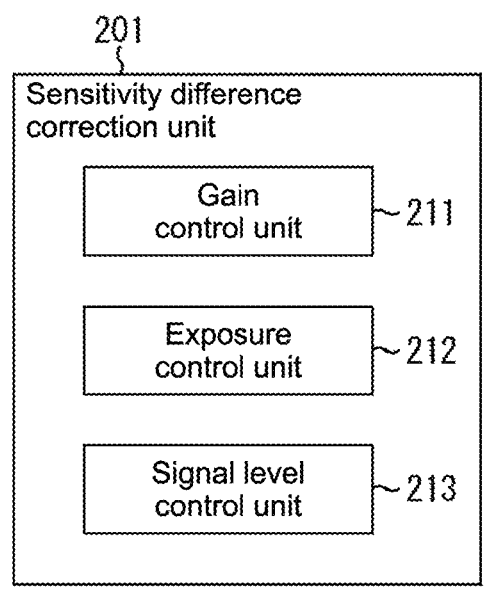
FIG. 6 A block diagram showing a configuration example of the function of a control unit.

FIG. 6 shows a part of a configuration example of the function of the control unit 27 of the solid-state image sensor 1. Specifically, FIG. 6 shows a configuration example of the function of a sensitivity difference correction unit 201 that corrects the sensitivity difference between the W pixel and the RGB pixel, among the functions of the control unit 27. The sensitivity difference correction unit 201 is configured to include a gain control unit 211, an exposure control unit 212, and a signal level control unit 213.

The gain control unit 211 controls the analog gain of each pixel on the basis of the amount of incident light and the sensitivity ratio of the W pixel and the G pixel (hereinafter, referred to as W/G sensitivity ratio) although the details will be described later.

The exposure control unit 212 controls the exposure time for each pixel on the basis of the amount of incident light and the W/G sensitivity ratio although the details will be described later.

The signal level control unit 213 controls the potential of the pixel signal of the W pixel (signal level Vsig) on the basis of the W/G sensitivity ratio although the details will be described later.

{Method of Correcting Sensitivity Difference Between W Pixel and RGB Pixel}

Next, a method of correcting the sensitivity difference between the W pixel and the RGB pixel in the solid-state image sensor 1 will be described.

Note that the case where the sensitivity of the W pixel having the highest sensitivity is two times as high as that of the G pixel having the second highest sensitivity, i.e., the case where the W/G sensitivity ratio is two times (6 dB) will be described below. Further, the case where the dynamic range of the analog gain to each pixel is 0 to 18 dB and the dynamic range of the DAC 41 (reference signal Vref) when the analog gain is set to a minimum value (0 dB) is 330 mV will be described below.

Further, in the following, description will be made, taking no account of the difference between the count values of the P-phase as being small, paying attention only to the count value of the D-phase, to simplify the description. Specifically, the case where the sensitivity difference is corrected so that the count values of the D-phase of the W pixel and the RGB pixel match for the same amount of incident light will be described as an example. Note that the sensitivity difference is actually corrected so that values obtained by subtracting the count values of the P-phase of the W pixel and the RGB pixel from the count values of the D-phase of the W pixel and the RGB pixel match for the same amount of incident light.

Further, although the case where the sensitivity difference between the W pixel and the G pixel is corrected will be mainly described in the following, also the sensitivity difference between the W pixel and the R pixel and the sensitivity difference between the W pixel and the B pixel are corrected on the basis of the W/G sensitivity ratio, similarly.

Figure 7:
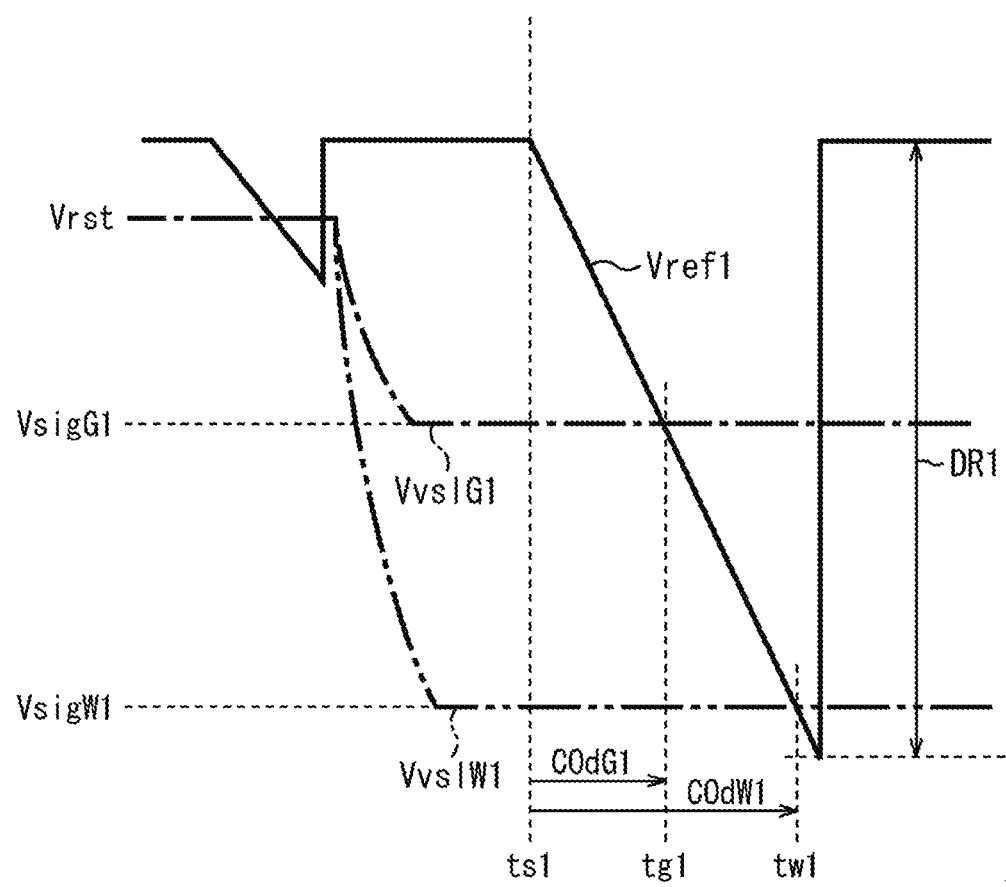
FIG. 7 A diagram schematically showing an example of the shift of each signal in the case where AD conversion of a pixel signal of a W pixel and a pixel signal of a G pixel is performed with the same amount of incident light.

FIG. 7 schematically shows an example of the shift of each signal in the case where AD conversion of a pixel signal VvslW1 of the W pixel and a pixel signal VvslG1 of the G pixel is performed with the same amount of incident light. Note that in FIG. 7, an example in which the analog gain is set to minimum 0 dB is shown. Specifically, an example in which the slope of a reference signal Vref1 is the highest, and a dynamic range DR1 of the DAC 41 is set to maximum 330 mV is shown.

Note that a time ts1 is time when reading of the D-phase is started. A time tg1 is time when the reference signal Vref1 is less than a signal level VsigG1 of the pixel signal VvslG1 and counting of the D-phase of the G pixel is finished. A time tw1 is time when the reference signal Vref1 is less than a signal level VsigW1 of the pixel signal VvslW1 and counting of the D-phase of the W pixel is finished. Therefore, a count value COdG1 for the period from the time ts1 to the time tg1 is a count value for the signal level VsigG1 of the G pixel. Further, a count value COdW1 for the period from the time ts1 to the time tw1 is a count value for the signal level VsigW1 of the W pixel.

Note that since the W/G sensitivity ratio is two times, the signal level VsigW1 of the pixel signal VvslW1 is −2 times the signal level VsigG1 of the pixel signal VvslG1 with the initial value of the reference signal Vref1 as a reference. Therefore, the count value COdW1 is twice as high as the count value COdG1, and an output signal Vout of the W pixel is twice as high as that of the G pixel.

Figure 8:
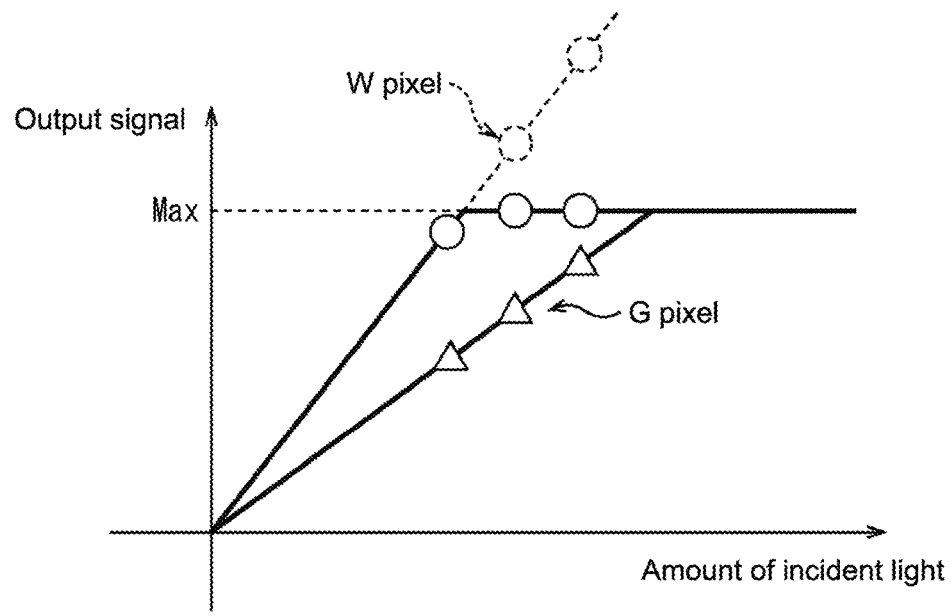
FIG. 8 A graph comparing the relationship between the amount of incident light and an output signal of a solid-state image sensor of the W pixel and the G pixel.

FIG. 8 is a graph comparing the relationship between the amount of incident light and the output signal Vout of the solid-state image sensor 1 of the W pixel and the G pixel. Since the sensitivity of the W pixel is higher than that of the G pixel, the output signal Vout of the W pixel is larger than that of the G pixel for the same amount of incident light. Therefore, the signal level Vsig of the W pixel exceeds the dynamic range of the DAC 41 before the G pixel, and the output signal Vout of the W pixel is saturated before the G pixel. As a result, the above-mentioned purple fringing is generated, thereby deteriorating the image quality.

Figure 9:
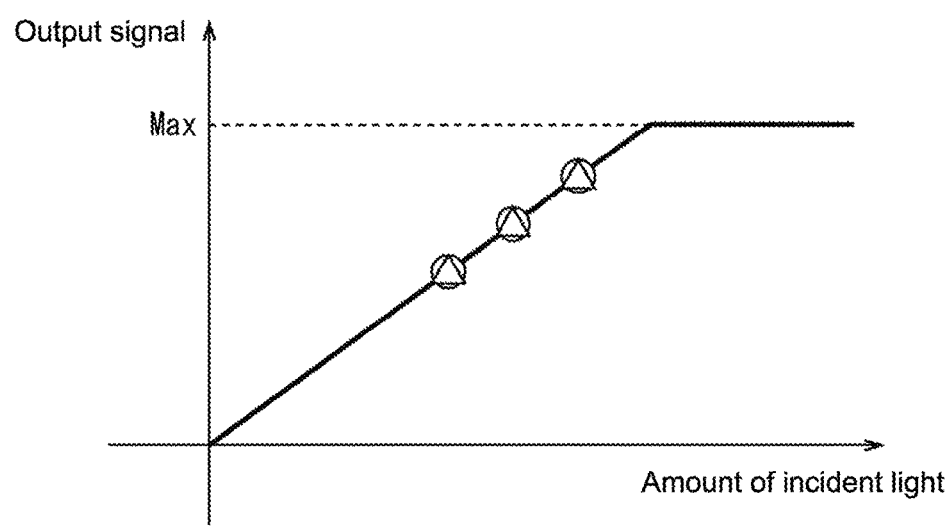
FIG. 9 A graph comparing the relationship between the amount of incident light and an output signal of a solid-state image sensor of the W pixel and the G pixel after correction of sensitivity difference.

Therefore, as shown in FIG. 9, it needs to correct the sensitivity difference so that the characteristics of the output signals Vout for the amount of incident light match between the W pixel and the G pixel. Specifically, it needs to make the count values of the D-phase of the W pixel and the G pixel for the same amount of incident light substantially the same, make the output signals Vout of the W pixel and the G pixel for the same amount of incident light substantially the same, and cause the W pixel and the G pixel to be saturated with substantially the same amount of incident light.

(First Sensitivity Difference Correction Method)

For example, a possible method of correcting the sensitivity difference between the W pixel and the G pixel is a method of making the exposure time for the W pixel shorter than that of the G pixel depending on the W/G sensitivity ratio. For example, in the case where the W/G sensitivity ratio is 6 dB, the exposure time for the W pixel is set to be shorter than that of the G pixel by the time corresponding to the sensitivity difference of 6 dB. More specifically, for example, the exposure time for the W pixel is set to ½ of that of the G pixel. Accordingly, it is possible to correct the sensitivity difference between the W pixel and the G pixel, and make the characteristics of the output signals Vout of the W pixel and the G pixel for the amount of incident light match as described above with reference to FIG. 9.

However, only by simply shortening the exposure time for the W pixel, the amount of incident light on the W pixel is restricted, and the amount of charges stored in the photodiode 101 is reduced. As a result, the SN ratio is reduced, and the merit of using the W pixel is reduced.

(Second Sensitivity Difference Correction Method)

Further, another possible method of correcting the sensitivity difference between the W pixel and the G pixel is a method of providing an offset between the analog gain of the W pixel and the analog gain of the G pixel depending on the W/G sensitivity ratio. For example, in the case where the W/G sensitivity ratio is 6 dB, an offset value (hereinafter, referred to as offset gain) is set to 6 dB, and the analog gain of the W pixel is set to be lower than that of the G pixel by 6 dB. Accordingly, it is possible to correct the sensitivity difference between the W pixel and the G pixel, and make the characteristics of the output signals Vout of the W pixel and the G pixel for the amount of incident light match as described above with reference to FIG. 9.

Figure 10:
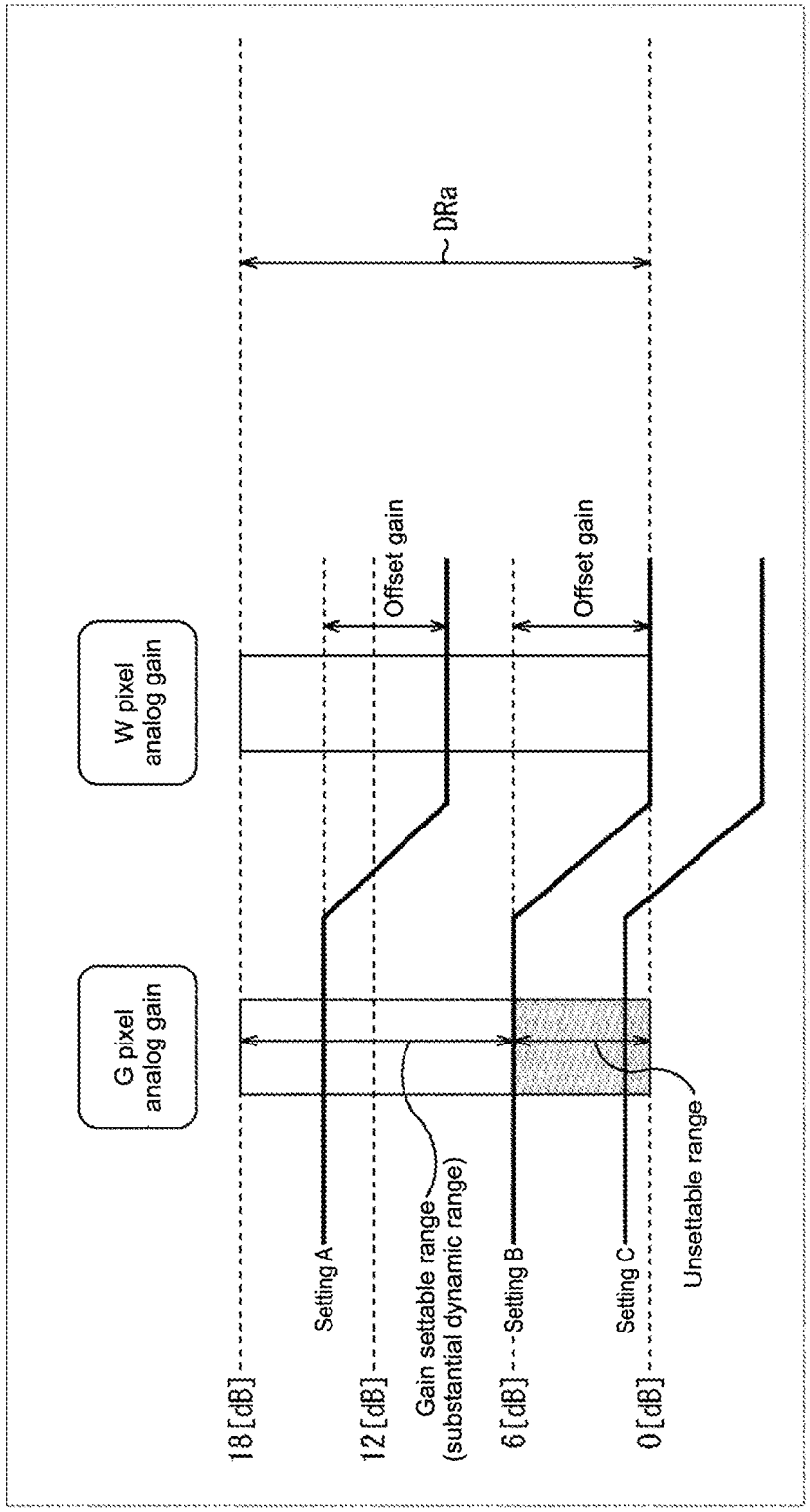
FIG. 10 A diagram for describing a settable range of an analog gain.

However, when the offset gain is set, the settable range of the analog gain (substantial dynamic range) is narrower than the actual dynamic range as shown in FIG. 10.

Specifically, in the case where the analog gain of the G pixel is within the range of 6 dB to 18 dB as in setting A and setting B, the analog gain of the W pixel can be set within the range of 0 dB to 12 dB, which is lower than the analog gain of the G pixel by 6 dB that is the offset gain. On the other hand, in the case where the analog gain of the G pixel is less than 6 dB as in setting C, the analog gain of the W pixel is less than 0 dB and exceeds the dynamic range of the analog gain when the analog gain of the W pixel is set to a value lower than that of the G pixel by 6 dB that is the offset gain.

Therefore, the range in which the analog gain of the G pixel can be actually set is 6 dB to 18 dB, and the range in which the analog gain of the W pixel can be set is 0 dB to 12 dB. Specifically, the settable range of the analog gain is narrowed by the amount corresponding to the offset gain, and the substantial dynamic range is halved.

In this regard, as described below, in the case where the analog gain of the G pixel is less than a predetermined threshold value (e.g., 6 dB), the dynamic range of the analog gain is prevented from being narrowed by shifting the dynamic range of the analog gain of the W pixel in the negative direction.

For example, the gain control unit 211 sets the analog gain of the G pixel depending on the amount of incident light. Then, in the case where the analog gain of the G pixel is less than 6 dB, the gain control unit 211 instructs the DAC 41 to set the reference current Iref to be twice as high as a normal one in at least the period when AD conversion of the W pixel is performed. Then, when the DAC 41 doubles the reference current Iref in accordance with the instruction, the output voltage of the DAC 41 is doubled.

Figure 11:
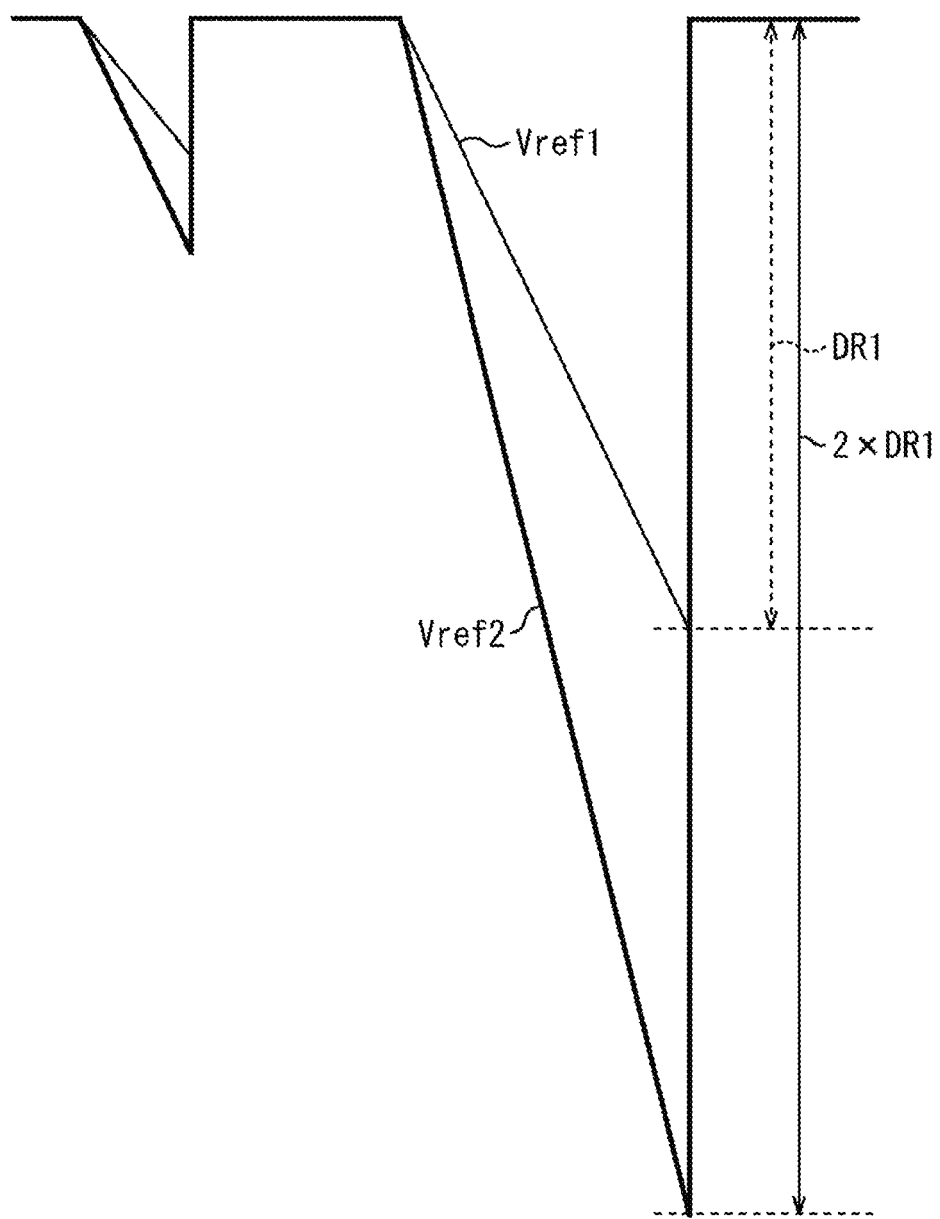
FIG. 11 A diagram describing an example of a change in a reference signal.

FIG. 11 shows an example of a change in a reference signal in the case where the reference current Iref is doubled. The reference signal Vref1 represents an example of the reference signal in the case where the analog gain is 0 dB. On the other hand, when the reference current Iref is doubled, the reference signal is changed from the reference signal Vref1 to a reference signal Vref2 having the slope that is twice as high as that of the reference signal Vref1. At this time, the dynamic range of the DAC 41 is changed from DR1 to 2×DR1. Further, the analog gain set by the reference signal Vref2 is −6 dB.

Figure 12:
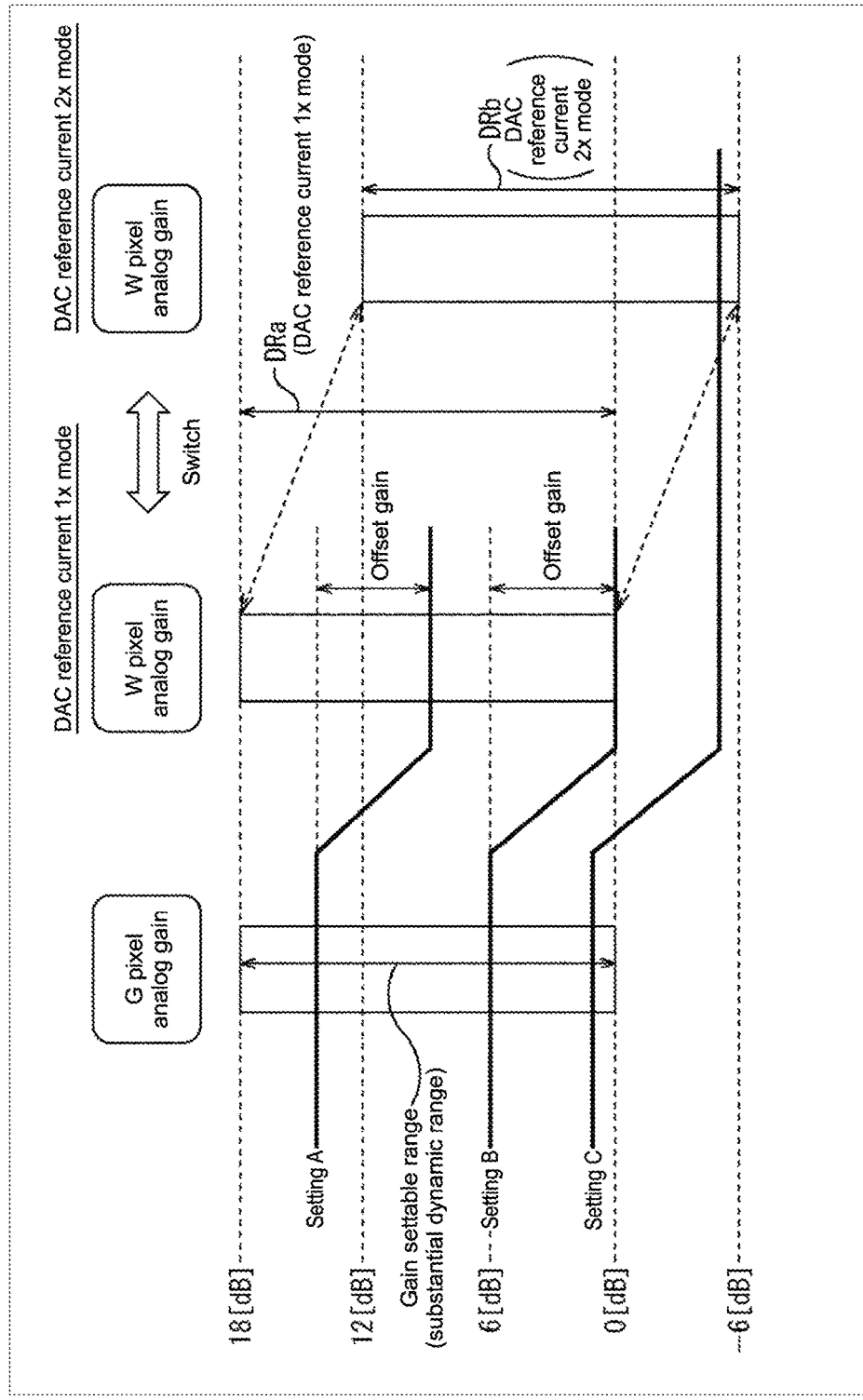
FIG. 12 A diagram for describing the shift of a dynamic range of the analog gain.

Then, as shown in FIG. 12, a dynamic range DRb of the analog gain of the W pixel when the reference current Iref is set to be doubled is shifted from a normal dynamic range DRa by −6 dB, i.e., −6 dB to 12 dB. Specifically, the dynamic range of the analog gain of the W pixel is shifted to the range lower than the dynamic range of the analog gain of the G pixel by 6 dB. Accordingly, also in the case where the analog gain of the G pixel is less than 6 dB, it is possible to set the value of the analog gain of the W pixel to be lower than that of the G pixel by 6 dB that is the offset gain.

As described above, it is possible to set the offset gain without narrowing the dynamic range of the analog gain by switching between a DAC reference current 1× mode in which the reference current Iref of the DAC 41 is set to a normal value (hereinafter, referred to as standard value) and a DAC reference current 2× mode in which the reference current Iref of the DAC 41 is set to be twice as high as a normal one, depending on the amount of incident light.

Now, with reference to FIG. 13 and FIG. 14, an example of the switching timing of the DAC reference current mode will be described.

Figure 13:
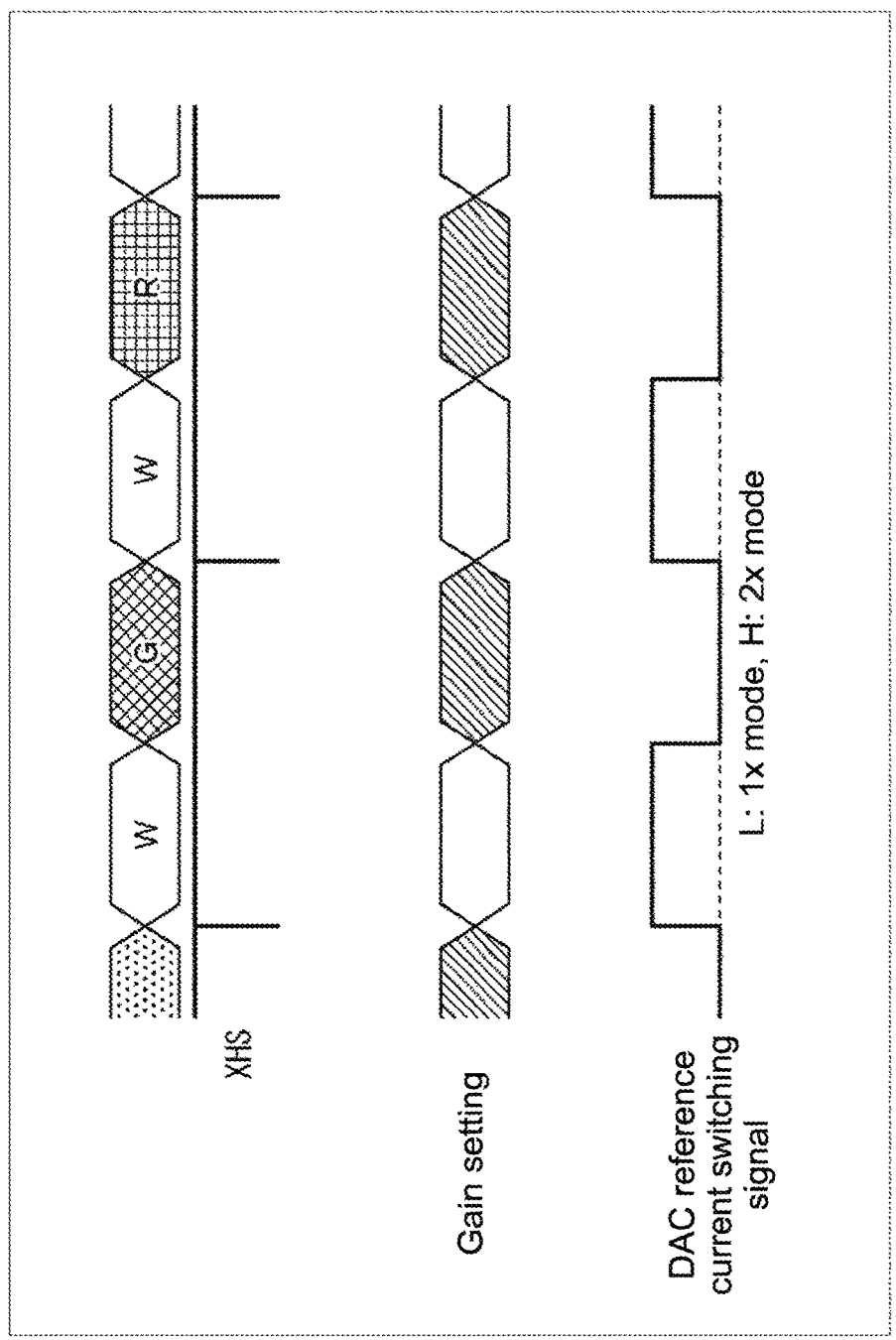
FIG. 13 A diagram showing a first example of a switching timing of a DAC reference current mode.

FIG. 13 shows a first example of the switching timing of the DAC reference current mode. The top row of FIG. 13 shows the timing of AD conversion of each pixel for an XHS (horizontal synchronous signal). In this example, AD conversion of one of the W pixel and the RGB pixel is performed in one horizontal period.

The second row shows the setting timing of the analog gain. The solid-white square represents the setting period of the analog gain of the W pixel, and the diagonal square represents the setting period of the analog gain of the RGB pixel.

The third row shows the shift of a DAC reference current switching signal. Note that the DAC reference current switching signal is a signal supplied from the gain control unit 211 to the DAC 41, for example. Then, in the case where the reference current switching signal is set to the L level, the DAC reference current 1× mode is set, and the reference current Iref of the DAC 41 is set to the standard value. On the other hand, in the case where the reference current switching signal is set to the H level, the DAC reference current 2× mode is set, and the reference current Iref of the DAC 41 is set to be twice as high as the standard value.

In this example of FIG. 13, the switching of the DAC reference current mode is dynamically performed in units of pixels for reading the output signal Vout on which AD conversion is performed. Specifically, the DAC reference current 2× mode is set during the AD conversion of the W pixel, and the DAC reference current 1× mode is set during the AD conversion of the RGB pixel.

Note that as shown in the figure, the DAC reference current mode during the AD conversion of the W pixel may be fixed to the DAC reference current 2× mode, or the DAC reference current 1× mode may be set also during the AD conversion of the W pixel in the case where the analog gain of the RGB pixel is not less than a predetermined threshold value (e.g., 6 dB), that is, in the case where the amount of incident light is not less than a predetermined threshold value.

Further, the unit of the pixel on which AD conversion is performed shown in FIG. 13 and the timing of the AD conversion are merely an example, and can be changed as necessary.

Figure 14:
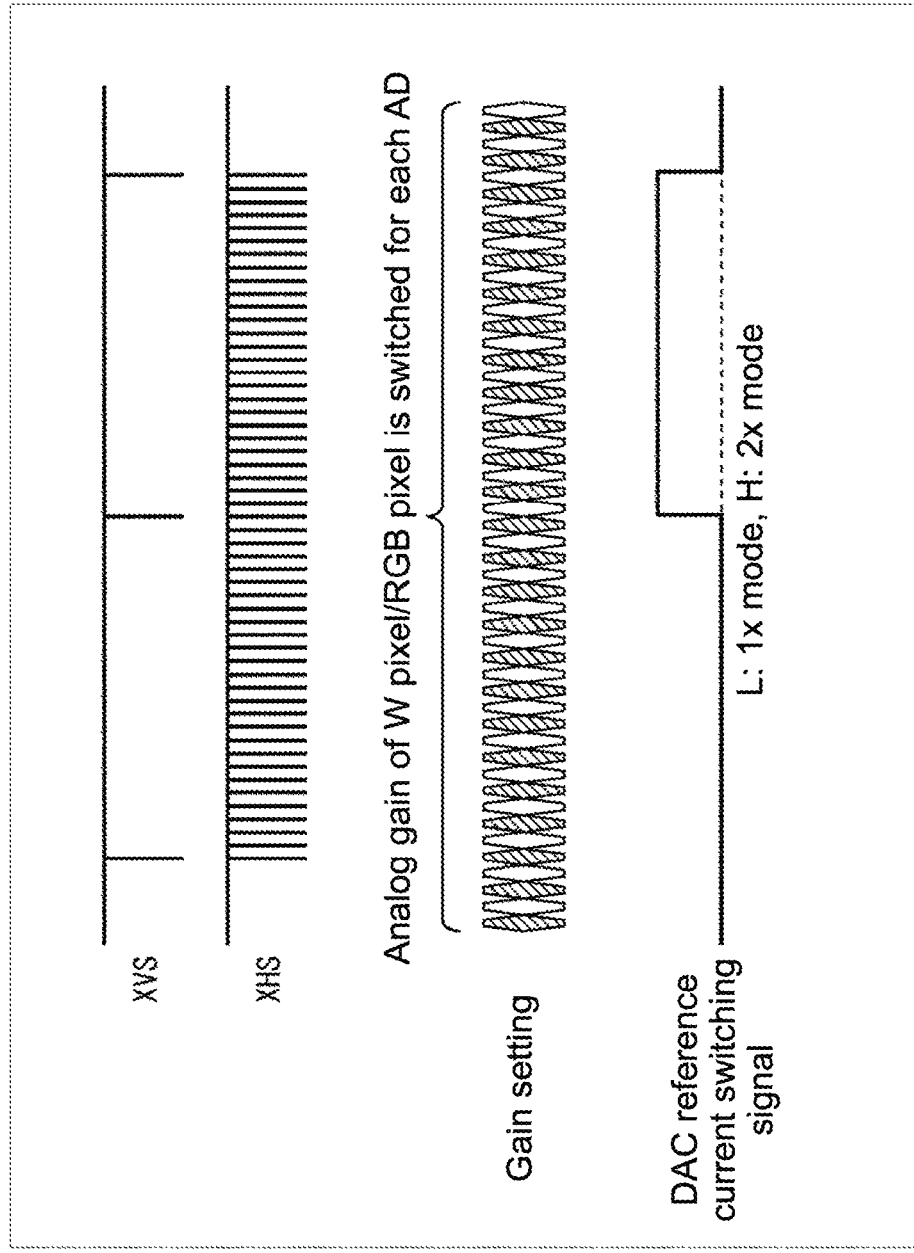
FIG. 14 A diagram showing a second example of the switching timing of the DAC reference current mode.

FIG. 14 shows a second example of the switching timing of the DAC reference current mode. The top row of FIG. 14 shows the shift of an XVS (vertical synchronous signal) and an XHS (horizontal synchronous signal).

The second row shows the setting timing of the analog gain. The solid-white square represents the setting period of the analog gain of the W pixel, and the diagonal square represents the setting period of the analog gain of the RGB pixel.

The third row represents the shift of a DAC reference current switching signal.

In this example of FIG. 14, switching of the DAC reference current mode is performed in units of frames. For example, the DAC reference current mode is fixed to a 1× mode in the frame in which the amount of incident light is not more than a predetermined threshold value and the analog gain of the RGB pixel is set to be not less than 6 dB. Specifically, in the frame, the reference current Iref of the DAC 41 is set to the standard value also during the AD conversion of any of the W pixel and the RGB pixel.

On the other hand, for example, the DAC reference current mode is fixed to a 2× mode in the frame in which the amount of incident light is larger than the predetermined threshold value and the analog gain of the RGB pixel is set to be less than 6 dB. Specifically, in the frame, the reference current Iref of the DAC 41 is set to be twice as high as the standard value also during the AD conversion of any of the W pixel and the RGB pixel.

As described above, it is possible to set the offset gain depending on the W/G sensitivity ratio without adding a change to the DAC 41 and narrowing the dynamic range of the analog gain.

Note that although an example in which the amplification rate of the reference current Iref of the DAC 41 is doubled when the dynamic range of the analog gain of the W pixel is shifted has been shown in the above description, it is desirable to change the amplification rate of the reference current depending on the W/G sensitivity ratio or the value of the offset gain.

(Third Sensitivity Difference Correction Method)

Taking into account the image quality, it is possible to match the dynamic range of the DAC 41 with the signal level Vsig (hereinafter, referred to as saturated level) of the unit pixel 31 in the state where the charges having the number of saturated electrons (Qs) are stored in the photodiode 101. More accurately, it is desirable to set the dynamic range of the DAC 41 to a value as close to the potential difference between the saturation level of the unit pixel 31 and the initial value of the reference signal Vref as possible.

Figure 15:
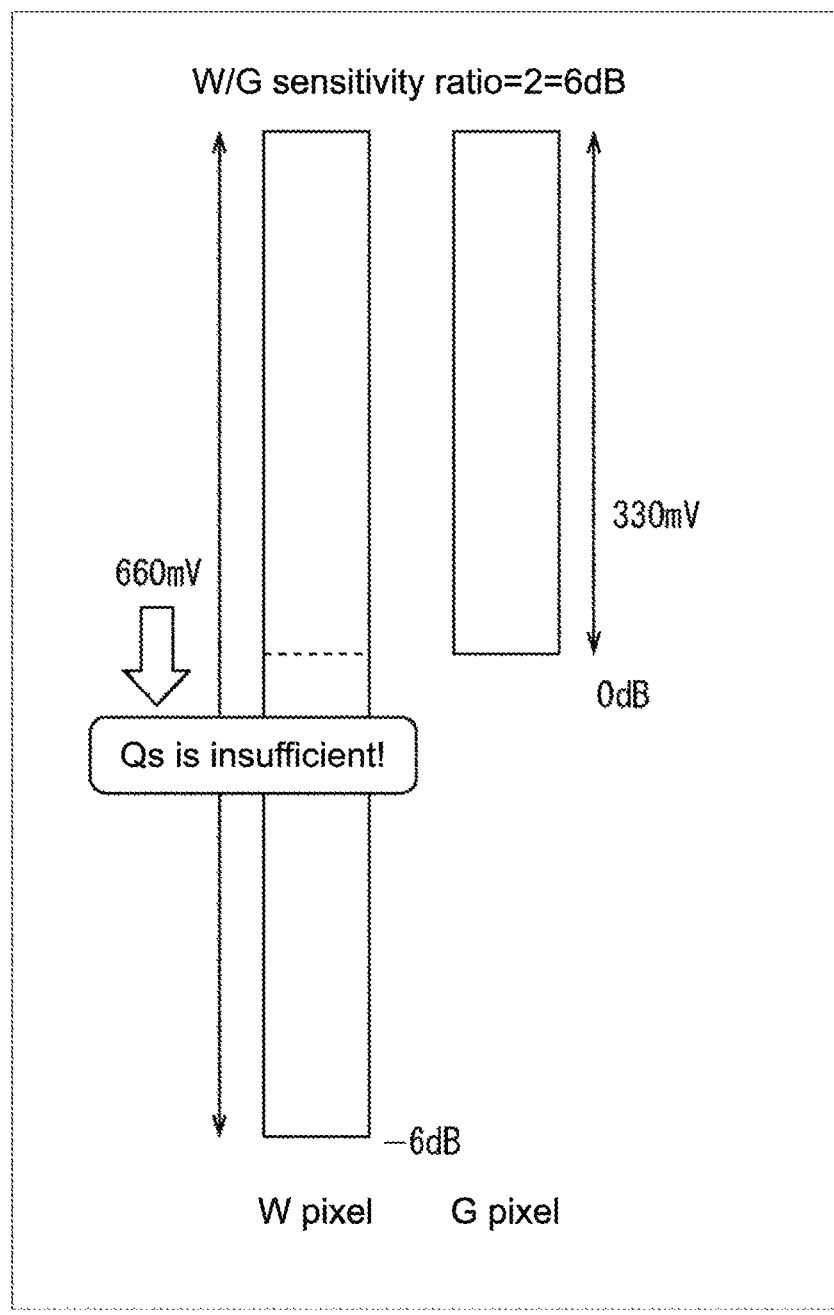
FIG. 15 A diagram for describing Qs shortage due to the shift of the analog gain.

On the other hand, in the above-mentioned second sensitivity difference correction method, the dynamic range of the DAC 41 for the W pixel is spread to 660 mV, which is twice as high as the dynamic range of the DAC 41 for the G pixel, when the analog gain of the W pixel is shifted in the negative direction, as shown in FIG. 15. Therefore, in the case where the saturation level of the unit pixel 31 is a value close to 330 mV, Qs of the photodiode 101 of the W pixel is insufficient. Specifically, before the output signal Vout is saturated by the signal level Vsig of the W pixel exceeding the dynamic range of the DAC 41, the photodiode 101 is saturated by the amount of stored charges of the photodiode 101 of the W pixel exceeding the number of saturated electrons. As a result, image unevenness occurs, thereby deteriorating the image quality.

In this regard, in the third sensitivity difference correction method, in the case where the amount of incident light is not less than a predetermined threshold value, the sensitivity difference between the W pixel and the G pixel is corrected by providing the time difference of the exposure time in addition to the gain difference of the analog gain between the W pixel and the G pixel.

For example, the gain control unit 211 sets the minimum value of the analog gain of the W pixel (hereinafter, referred to as minimum gain) to be lower than that in the above-mentioned example with reference to FIG. 7 and the like, by expanding the dynamic range of the DAC 41 for the W pixel to substantially the saturation level of the unit pixel 31. For example, in the case where the saturation level of the unit pixel 31 is 370 mV, the gain control unit 211 sets the minimum gain of the W pixel to −1 dB by setting the dynamic range of the DAC 41 for the W pixel to 370 mV. Accordingly, the settable range of the analog gain of the W pixel is −1 dB to 18 dB, but is practically −1 dB to 12 dB taking into account the offset gain. As a result, the minimum gain of the W pixel is lower than that of the G pixel by 1 dB, and it is possible to perform correction corresponding to the amount of 1 dB in 6 dB of the sensitivity difference between the W pixel and the G pixel.

Then, correction corresponding to the remaining 5 dB can be performed by adjusting the minimum gain of the G pixel and the exposure time for the W pixel.

For example, the gain control unit 211 sets the minimum gain of the G pixel to 3 dB by setting the dynamic range of the DAC 41 for the G pixel to 234 mV, as compared with the above-mentioned example with reference to FIG. 7 and the like. Accordingly, the settable range of the analog gain of the G pixel is 3 dB to 18 dB. As a result, the minimum gain of the G pixel is higher than that of the W pixel by 4 dB, and it is possible to perform correction corresponding to the amount of 4 dB in 6 dB of the sensitivity difference between the W pixel and the G pixel.

Then, the exposure control unit 212 makes the exposure time for the W pixel shorter than that for the RGB pixel by the time corresponding to the sensitivity difference of the remaining 2 dB.

Figure 16:
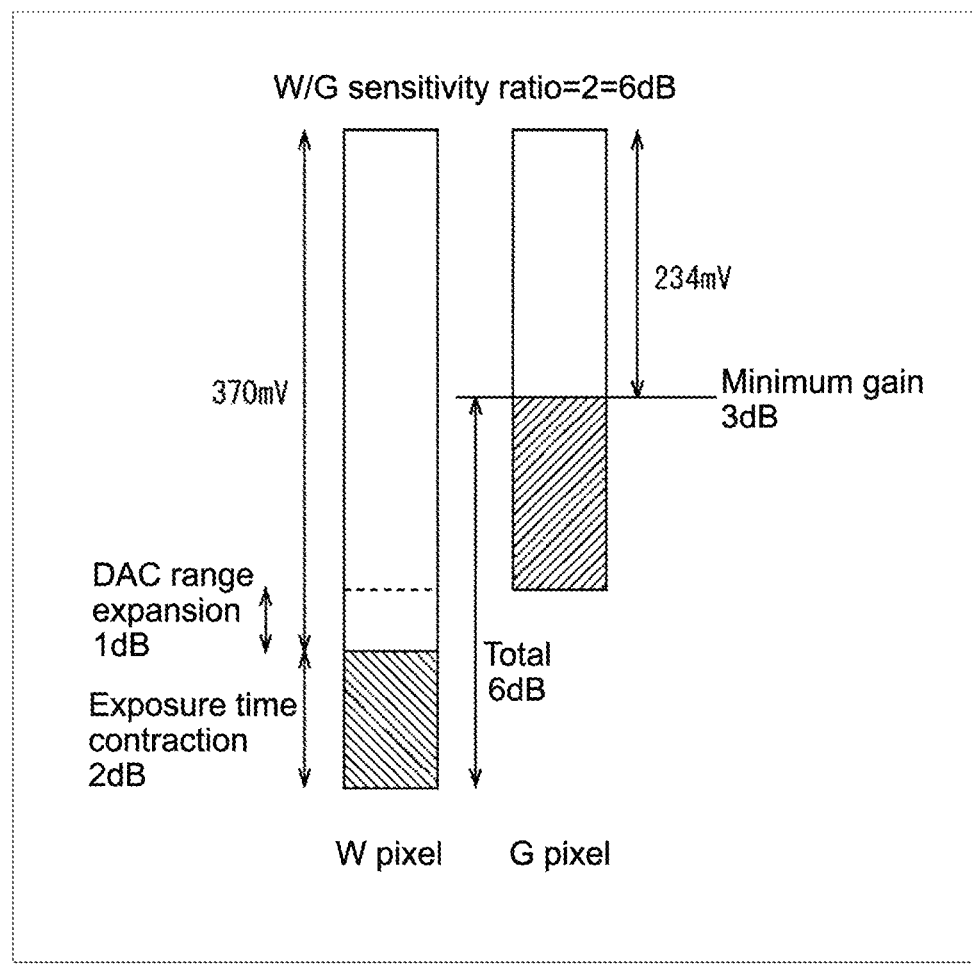
FIG. 16 A diagram for describing overview of a third sensitivity difference correction method.
Figure 17:
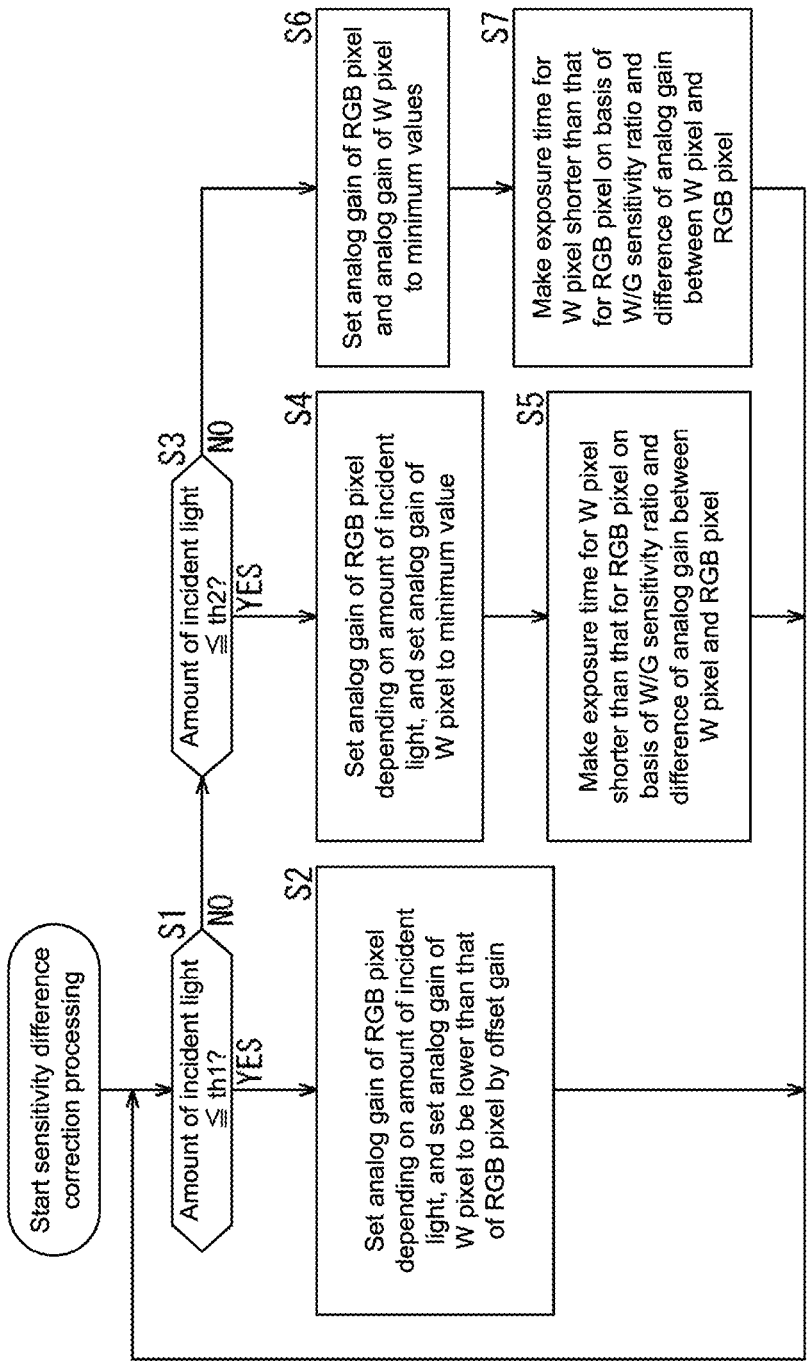
FIG. 17 A flowchart for describing sensitivity difference correction processing in the third sensitivity difference correction method.

Accordingly, as shown in FIG. 16, the sensitivity difference of 6 dB between the W pixel and the G pixel is corrected. Specifically, correction corresponding to the amount of 1 dB is performed by expanding the dynamic range of the DAC 41 for the W pixel, correction corresponding to the amount of 3 dB is performed by increasing the minimum gain of the G pixel, and correction corresponding to the amount of 2 dB is performed by reducing the exposure time for the W pixel.

Note that in the graph of FIG. 16, the part corresponding to the amount of correction is shown to be longer than any other part, to emphasize the amount of correction of the sensitivity difference.

Note that the minimum gain of the G pixel is set to a value higher than the minimum gain of the W pixel by 4 dB that is lower than the offset gain (6 dB). Specifically, the offset value of the minimum gain of the W pixel and he minimum gain of the G pixel (hereinafter, referred to as minimum offset gain) is 4 dB.

In Step S1, the gain control unit 211 determines whether or not the amount of incident light on the pixel array unit 21 is not more than a predetermined threshold value th1. In the case where it is determined that the amount of incident light on the pixel array unit 21 is not more than the predetermined threshold value th1, the processing proceeds to Step S2. Note that the range of this amount of incident light corresponds to the range in which the analog gain of the RGB pixel is set to 5 dB to 18 dB.

In Step S2, the gain control unit 211 sets the analog gain of the RGB pixel depending on the amount of incident light, and sets the analog gain of the W pixel to be lower than that of the RGB pixel by the offset gain. For example, the gain setting unit 211 sets the analog gain of the RGB pixel to the range of 5 dB to 18 dB depending on the amount of incident light. Further, the gain control unit 211 sets the analog gain of the W pixel to a value lower than the analog gain of the RGB pixel by the offset gain. Accordingly, the sensitivity difference between the W pixel and the RGB pixel is corrected by the offset gain.

After that, the processing returns to Step S1, and the processing of Step S1 and subsequent Steps are performed.

On the other hand, in the case where it is determined that the amount of incident light on the pixel array unit 21 exceeds the predetermined threshold value th1 in Step S1, the processing proceeds to Step S3.

In Step S3, the gain control unit 211 determines whether or not the amount of incident light on the pixel array unit 21 is not more than a predetermined threshold value th2. Note that the threshold value th2 is set to a value larger than the threshold value th1. In the case where it is determined that the amount of incident light on the pixel array unit 21 is not more than the predetermined threshold value th2, i.e., in the case where the threshold value th1 the amount of incident light the threshold value th2, the processing proceeds to Step S4. Note that the range of this amount of incident light corresponds to the range in which the analog gain of the RGB pixel is set to 3 dB to 5 dB.

In Step S4, the gain control unit 211 sets the analog gain of the RGB pixel depending on the amount of incident light, and sets the analog gain of the W pixel to a minimum value. For example, the gain setting unit 211 sets the analog gain of the RGB pixel to the range of 3 dB to 5 dB depending on the amount of incident light. Further, the gain setting unit 211 sets the analog gain of the W pixel to −1 dB that is the minimum gain. Therefore, the difference of the analog gain between the W pixel and the RGB pixel is lower than the sensitivity difference between the W pixel and the RGB pixel, and it is difficult to correct the sensitivity difference between the W pixel and the RGB pixel only by the difference of the analog gain.

In this regard, in Step S5, the exposure control unit 212 makes the exposure time for the W pixel shorter than that for the RGB pixel on the basis of the W/G sensitivity ratio and the difference of the analog gain between the W pixel and the RGB pixel.

For example, in the case where the analog gain of the W pixel is set to −1 dB and the analog gain of the RGB pixel is set to 4 dB, the difference between them is 5 dB. On the other hand, because the W/G pixel ratio is 6 dB, it is difficult to perform correction corresponding to the amount of 1 dB in 6 dB of the sensitivity difference between the W pixel and the RGB pixel only by the analog gain.

In this regard, the exposure control unit 212 sets the exposure time for the W pixel to be lower than the exposure time for the RGB pixel by the time corresponding to the sensitivity difference of 1 dB. For example, the exposure control unit 212 sets the exposure time for the W pixel to be approximately 89% of the exposure time for the RGB pixel.

As described above, the exposure time for the W pixel is made shorter than that for the RGB pixel depending on the amount corresponding to the difference between the gain difference of the analog gain between the W pixel and the RGB pixel and the offset gain. Accordingly, the sensitivity difference between the W pixel and the RGB pixel is corrected by the gain difference of the analog gain between the W pixel and the RGB pixel and the time difference of the exposure time.

After that, the processing returns to Step S1, and the processing of Step S1 and the subsequent Steps is performed.

On the other hand, for example, in the case where the object is very bright and it is determined that the amount of incident light on the pixel array unit 21 exceeds the threshold value th2 in Step S3, the processing proceeds to Step S6.

In Step S6, the gain control unit 211 sets the analog gain of the RGB pixel and the analog gain of the W pixel to minimum values. Specifically, the gain control unit 211 sets the analog gain of the RGB pixel to 3 dB that is the minimum gain, and the analog gain of the W pixel to −1 dB that is the minimum gain. Therefore, the difference of the analog gain between the W pixel and the RGB pixel is 4 dB.

In Step S7, the exposure control unit 212 makes the exposure time for the W pixel shorter than that for the RGB pixel on the basis of the W/G sensitivity ratio and the difference of the analog gain between the W pixel and the RGB pixel. Specifically, in this case, because the difference of the analog gain between the W pixel and the RGB pixel is 4 dB, it is difficult to perform correction corresponding to the amount of 2 dB in 6 dB that is the sensitivity difference between the W pixel and the RGB pixel only by the difference of the analog gain.

In this regard, the exposure control unit 212 sets the exposure time for the W pixel to be shorter than that for the RGB pixel by the time corresponding to the sensitivity difference of 2 dB. For example, the exposure control unit 212 sets the exposure time for the W pixel to be approximately 79% of the exposure time for the GB pixel. Accordingly, the sensitivity difference between the W pixel and the RGB pixel is corrected by the gain difference of the analog gain between the W pixel and the RGB pixel and the time difference of the exposure time.

Now, with reference to FIG. 18 and FIG. 19, a specific example of AD conversion processing performed after the analog gain and the exposure time are set in the processing of Steps S6 and S7 will be described.

Figure 18:
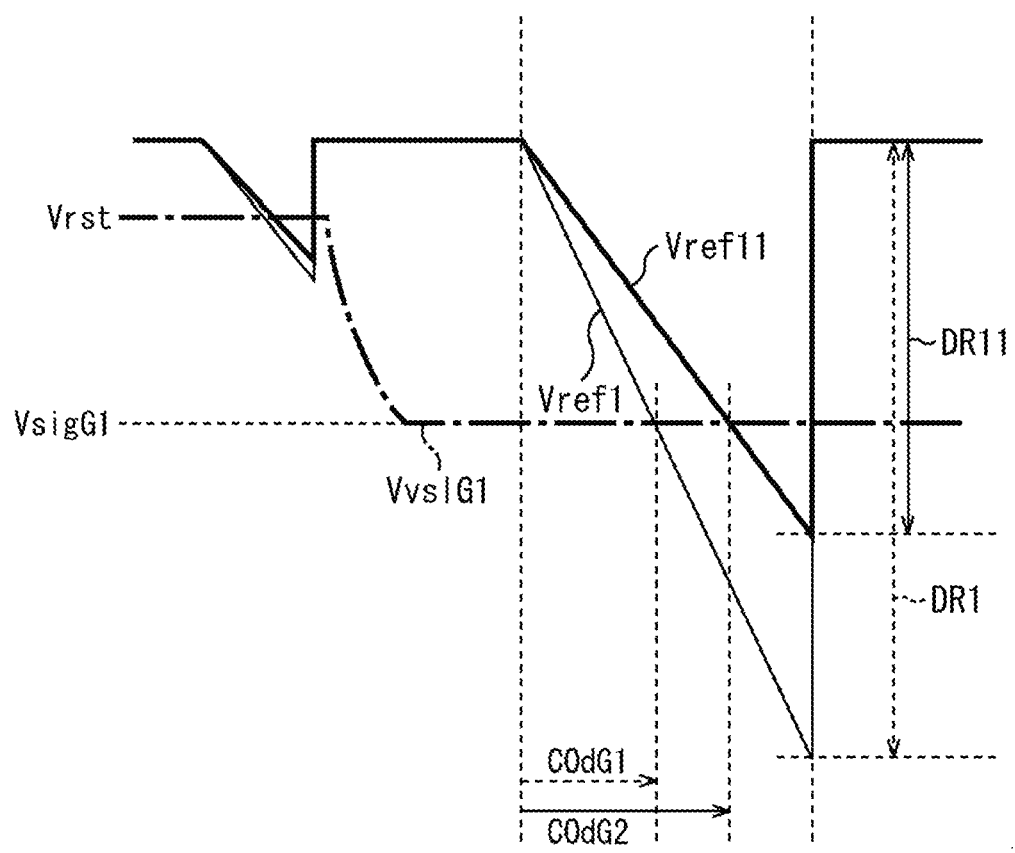
FIG. 18 A diagram for describing an example of AD conversion processing of the G pixel in the third sensitivity difference correction method.

FIG. 18 shows the shift of each signal when AD conversion of the G pixel is performed. By setting the minimum gain of the G pixel to be higher than that in FIG. 7 by 3 dB, a dynamic range DR11 of a reference signal Vref11 used for AD conversion is smaller than the dynamic range DR1 of the reference signal Vref1. Further, the slope of the reference signal Vref11 is lower than that of the reference signal Vref1. Accordingly, a count value COdG2 for the signal level VsigG1 of the G pixel is larger than the count value COdG1 described above with reference to FIG. 7.

Figures 19, 20:
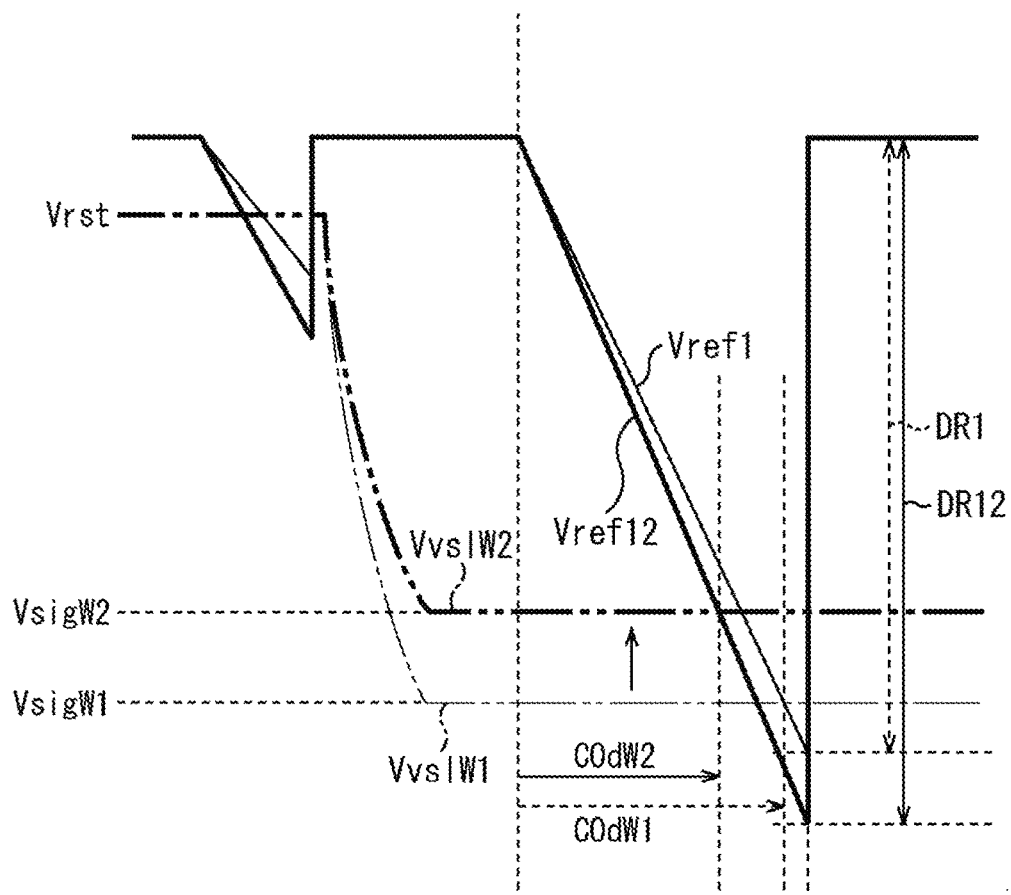
FIG. 19 A diagram for describing an example of the AD conversion processing of the W pixel in the third sensitivity difference correction method.
FIG. 20 A table showing an example of the color temperature and the W/G sensitivity ratio of a light source.

FIG. 19 shows the shift of each signal when AD conversion of the W pixel is performed. By setting the minimum gain of the W pixel to be lower than that in FIG. 7 by 1 dB, a dynamic range DR12 of a reference signal Vref12 used for AD conversion is larger than the dynamic range DR1 of the reference signal Vref1. Further, the slope of the reference signal Vref12 is higher than that of the reference signal Vref1. Further, by making the exposure time for the W pixel shorter, the absolute value of a signal level VsigW2 of the W pixel is smaller than that of the signal level VsigW1 of the case where the exposure time is not reduced. Accordingly, a count value COdW2 for the signal level VsigW2 of the W pixel is larger than the count value COdW1 described above with reference to FIG. 7.

Then, the count value COdG2 of the G pixel equals to the count value COdW2 of the W pixel, and the values of the output signal Vout the G pixel and the output signal Vout of the W pixel match. In this way, the sensitivity difference between the W pixel and the G pixel is corrected.

After that, the processing returns to Step S1, and the processing of Step S1 and the subsequent Steps is performed.

In this way, the sensitivity difference between the W pixel and the RGB pixel is corrected by the gain difference of the analog gain between the W pixel and the RGB pixel and the time difference of the exposure time, and thus, it is possible to suppress the deterioration of image quality. Further, it is possible to prevent image unevenness from occurring due to Qs shortage of the W pixel caused by the too low analog gain of the W pixel as described above with reference to FIG. 15. Further, it is possible to make the exposure time for the W pixel longer and suppress the reduction in the SN ratio due to the decrease in the amount of incident light as compared with the case where the sensitivity difference is corrected only by the exposure time.

Note that in the above description, the example in which for 5 dB in 6 dB of the sensitivity difference between the W pixel and the G pixel, which excludes 1 dB corresponding to the amount of correction by the expansion of the dynamic range of the DAC 41, correction corresponding to 3 dB is performed by increasing the minimum gain of the RGB pixel and correction corresponding to 2 dB is performed by making the exposure time for the W pixel shorter, has been shown. However, the ratio between the amounts of correction can be set to an arbitrary value on the basis of the result of image evaluation or the like.

It should be noted that because the SN ratio is reduced also when the minimum gain of the RGB pixel is increased too much or the exposure time for the W pixel is made too short, it is conceivable that the ratio between them is set to 1:1 or a ratio close thereto, for example. In this case, for example, the amount of correction by the increase in the minimum gain of the RGB pixel is set to 2.5 dB, and the amount of correction by the reduction in the exposure time for the W pixel is set to 2.5 dB.

Further, in the case where it is difficult to expand the dynamic range of the DAC 41, the sensitivity difference may be corrected only by the increase in the minimum gain of the RGB pixel and the reduction in the exposure time for the W pixel. For example, the amount of correction by the increase in the minimum gain of the RGB pixel may be set to 3 dB, and the amount of correction by the reduction in the exposure time for the W pixel may be set to 3 dB.

Further, the W/G sensitivity ratio is different for the type of the light source or the color temperature. FIG. 20 shows an example of the correspondence relationship between the type of the light source and the color temperature and the W/G sensitivity ratio. For example, the color temperature of a standard light source A is 2900 K, and the W/G sensitivity ratio is 1.89×(5.5 dB). The color temperature of a fluorescent light is 4300 K, and the W/G sensitivity ratio is 1.81×(5.2 dB). The color temperature of a standard light source D70 is 7400 K, and the W/G sensitivity ratio is 2.0×(6.0 dB).

As described above, because the W/G sensitivity ratio is different for the type of a light source and the color temperature, it is desirable to adjust the amount of increase in the minimum gain of the RGB pixel as well as the offset gain with the kind of a light source and the color temperature. Note that the minimum offset gain is adjusted by adjusting the amount of increase in the minimum gain of the RGB pixel.

For example, the gain control unit 211 acquires light source estimation information or white balance information, which represents the type of a light source or the color temperature, from the outside. Then, the gain control unit 211 sets the offset gain and adjusts the amount of increase in the minimum gain of the RGB pixel depending on the W/G sensitivity ratio based on the type of a light source or the color temperature represented by the light source estimation information or the white balance information. For example, the gain control unit 211 sets the offset gain to 5.2 dB and sets the amount of increase in the minimum gain to 2.2 dB in the case where the light source estimation information represents a fluorescent light. Accordingly, the maximum value of the amount of correction by the reduction in the exposure time for the W pixel is set to 2 dB. Further, the minimum offset gain is set to 3.2 dB.

Note that in the case where it is difficult to obtain the information related to the light source or the color temperature, for example, it is desirable to set the offset gain and the amount of increase in the minimum gain of the RGB pixel on the basis of the W/G sensitivity ratio of the light source having the largest W/G sensitivity ratio among light sources that are assumed to be used.

(Fourth Sensitivity Difference Correction Method)

Next, with reference to FIG. 21 and FIG. 22, a fourth sensitivity difference correction method will be described.

Figure 21:
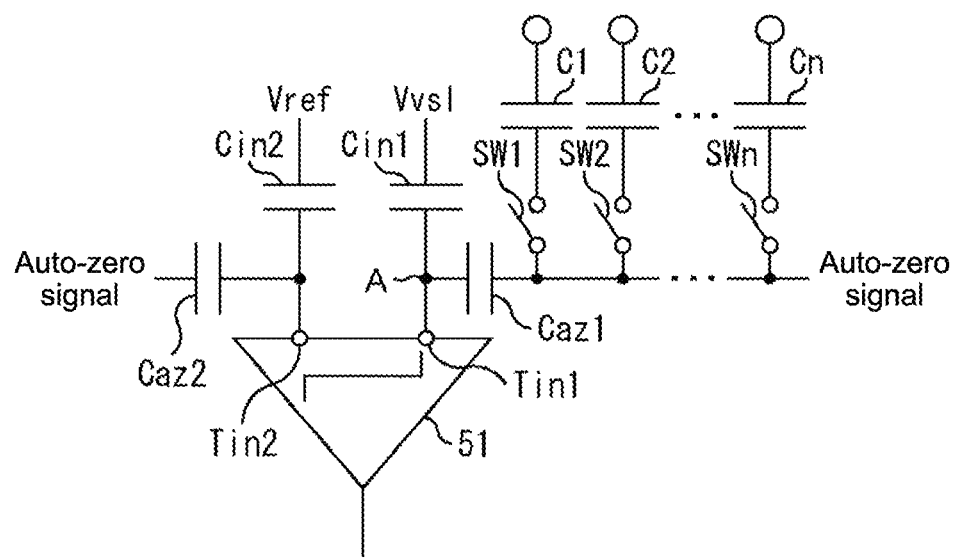
FIG. 21 A detailed circuit diagram showing the vicinity of a comparator of the AD converter.
Figure 22:
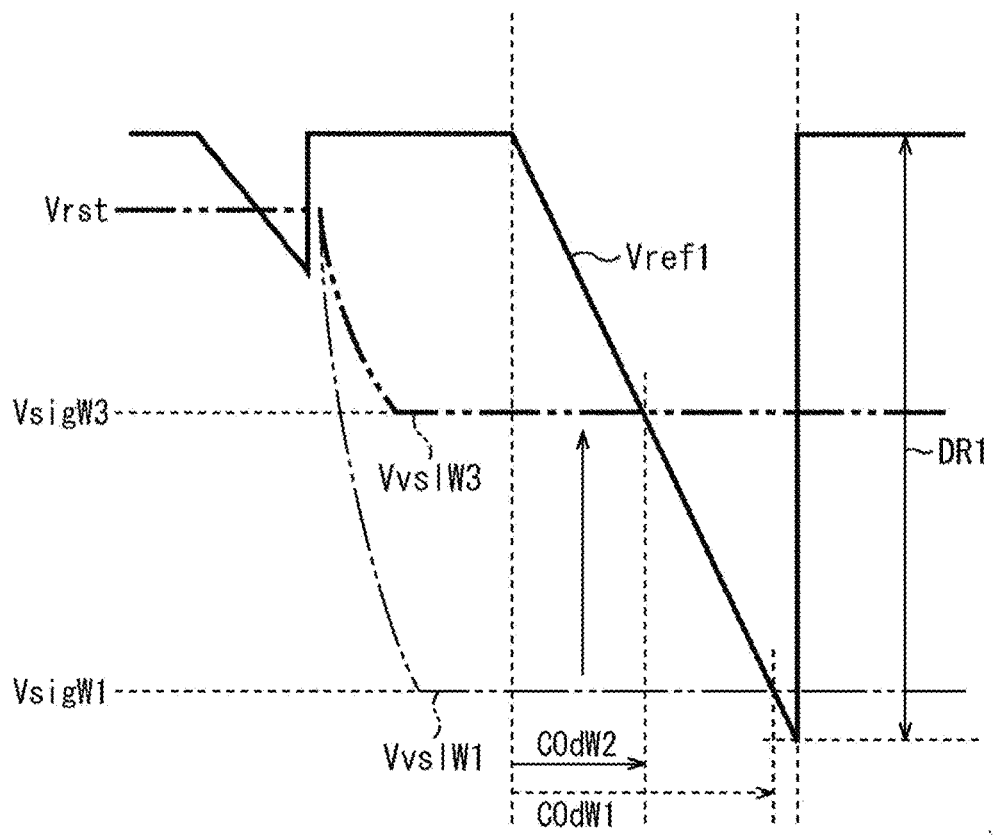
FIG. 22 A diagram showing an example of the shift of a signal level of the W pixel.

FIG. 21 is a detailed circuit diagram showing the vicinity of the comparator 51 of the ADC 23 in the case where the fourth sensitivity difference correction method is applied.

In this example, the pixel signal Vvs1 is input to an input terminal Tin1 of the comparator 51 via a capacitor Cin1. The reference signal Vref is input to an input terminal Tin2 of the comparator 51 via a capacitor Cin2. An auto-zero signal is input to the input terminal Tin1 of the comparator 51 via a capacitor Caz1. Further, the auto-zero signal is input to the input terminal Tin2 of the comparator 51 via a capacitor Caz2.

Note that the auto-zero signal is a signal having a predetermined reference potential and a signal for eliminating the potential difference between the input terminal Tin1 and the input terminal Tin2 of the comparator 51 by being input to the input terminals Tin1 and Tin2 of the comparator 51 as described above with reference to FIG. 4.

To one end of the capacitor Caz1, which is different from the other end of the capacitor Caz1 connected to the input terminal Tin1 capacitors C1 to Cn are respectively connected via switches SW1 to SWn. Each of other ends of the capacitors C1 to Cn is connected to a predetermined power supply (not shown).

For example, when the switch SW1 is turned on, the capacitor C1 and the capacitor Caz1 are connected in series. Further, for example, when the switch SW2 is turned on, the capacitor C2 and the capacitor Caz1 are connected in series.

For example, the capacitors C1 to Cn are set to different capacities, and it is possible to change the coupling ratio of the input terminal Tin1 of the comparator 51 on the input side of an auto-zero signal by controlling turning on/off of the switches SW1 to SWn. By changing this coupling ratio, it is possible to adjust the potential at a point A, i.e., the level of the pixel signal Vvs1.

In this regard, for example, the signal level control unit 213 controls turning on/off of the switches SW1 to SWn during the AD conversion of the W pixel so that the signal level Vsig of the W pixel is halved, thereby changing the coupling ratio of the input terminal Tin1 of the comparator 51 on the input side of an auto-zero signal. As a result, as shown in FIG. 22, the signal level Vsig of the W pixel is shifted by the amount corresponding to the W/G sensitivity ratio. Specifically, the signal level Vsig of the W pixel is shifted from the signal level VsigW1 to a signal level VsigW3 that is equal to the signal level VsigG1 of the G pixel. Accordingly, the count value of the D-phase of the W pixel is the same count value COdW2 as that described above in FIG. 19, the sensitivity difference between the W pixel and the RGB pixel is corrected, and the output signals Vout match.

Note that as described above with reference to FIG. 20, the W/G sensitivity difference is different for the type of a light source and the color temperature. In this regard, the signal level control unit 213 may adjust the shift amount of the signal level Vsig of the W pixel to an appropriate value by individually controlling the states of the switches SW1 to SWn depending on the type of a light source or the color temperature, changing the capacitor to be connected, and adjusting the coupling ratio.

Note that in the case where it is difficult to obtain the information related to the light source or the color temperature, for example, it is desirable to set the capacity of the capacitor to be connected during the AD conversion of the W pixel on the basis of the W/G sensitivity ratio of the light source having the largest W/G sensitivity ratio among light sources that are assumed to be used.

Further, it does not necessarily need to connect the capacitors C1 to Cn one by one for use, two or more capacitors may be connected, and the coupling ratio may be adjusted by the combination of capacitors connected in parallel.

(Fifth Sensitivity Difference Correction Method)

Figure 24:
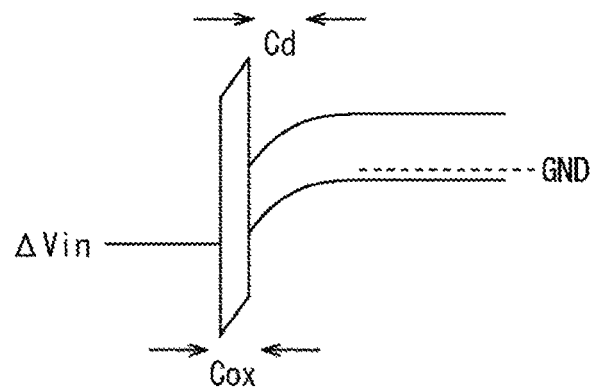
FIG. 24 A diagram for describing the connection state of an oxide film capacitance of the amplification transistor and a substrate capacitance.
Figure 25:
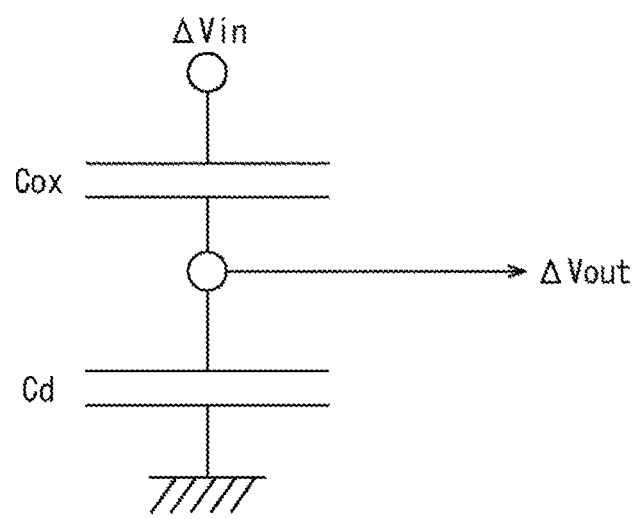
FIG. 25 A diagram for describing the connection state of an oxide film capacitance of the amplification transistor and a substrate capacitance.

Next, with reference to FIG. 23 to FIG. 25, a fifth sensitivity difference correction method will be described.

In the fifth sensitivity difference correction method, the signal level Vsig of the W pixel is shifted so that the signal level Vsig of the W pixel matches with the signal level Vsig of the G pixel for the same amount of incident light depending on the W/G sensitivity ratio by a method different from the fourth sensitivity difference correction method. Specifically, in the fifth sensitivity difference correction method, the signal level Vsig of the W pixel is shifted by making the gain of the amplification transistor 104 of the W pixel lower than that of the amplification transistor 104 of the G pixel.

Figure 23:
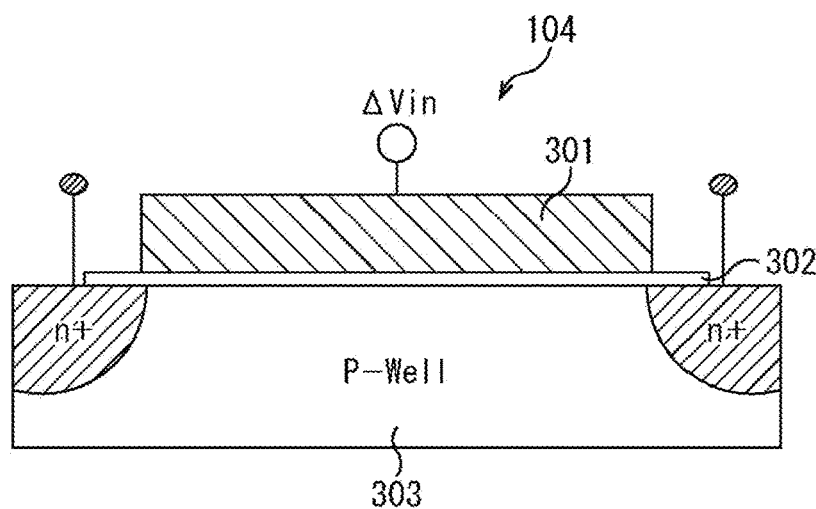
FIG. 23 A schematic cross-sectional diagram of an amplification transistor of the unit pixel.

FIG. 23 schematically shows the cross-section of the amplification transistor 104. Between a gate electrode 301 of the amplification transistor 104 and a semiconductor substrate 303, an oxide film 302 is formed. Then, in the amplification transistor 104, an oxide film capacitance Cox of the oxide film 302 and a substrate capacitance (depletion capacitance) Cd of the semiconductor substrate 303 are connected in series as shown in FIG. 24 and FIG. 25.

Note that when input voltage to the gate electrode 301 is ΔVin and output voltage (drain voltage) of the amplification transistor 104 is 66 Vout, ΔVout can be calculated by using the following equation (1).

$$\Delta Vout = Cox/(Cd+Cox) \times \Delta Vin \qquad (1)$$

Then, the modulation degree ΔVout/ΔVin of the amplification transistor 104 can be calculated by using the following equation (2).

$$\Delta Vout/\Delta Vin = Cox/(Cd+Cox) \qquad (2)$$

Therefore, for changing the modulation degree ΔVout/ΔVin of the amplification transistor 104 (gain of the amplification transistor 104), at least one of the oxide film capacitance Cox and the substrate capacitance Cd only has to be changed.

Note that the oxide film capacitance Cox can be adjusted by, for example, the thickness of the oxide film 302. Further, the substrate capacitance Cd can be adjusted by, for example, changing the impurity profile of the semiconductor substrate 303. Note that it is easier to adjust the substrate capacitance Cd than to adjust the oxide film capacitance Cox.

Then, for example, the modulation degree of the amplification transistor 104 of the W pixel is adjusted, and the gain of the amplification transistor 104 of the W pixel is made lower than that of the amplification transistor 104 of the RGB pixel by the W/G sensitivity ratio. Accordingly, as described in FIG. 22, the signal level Vsig of the W pixel is shifted from VsigW1 to VsigW3, and the sensitivity difference between the W pixel and the RGB pixel can be corrected.

(Sixth Sensitivity Difference Correction Method)

Next, with reference to FIG. 26 and FIG. 27, a sixth sensitivity difference correction method will be described.

In the sixth sensitivity difference correction method, the signal level Vsig of the W pixel is shifted so that the signal level Vsig of the W pixel matches with the signal level Vsig of the G pixel for the same amount of incident light depending on the W/G sensitivity ratio by a method different from the fourth and fifth sensitivity difference correction methods. Specifically, in the sixth sensitivity difference correction method, the signal level Vsig of the W pixel is shifted by changing the conversion efficiency of the FD unit 106.

Figure 26:
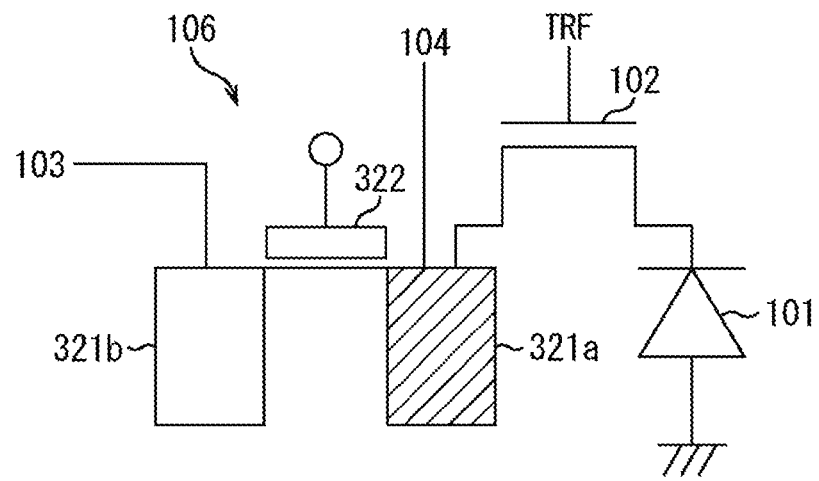
FIG. 26 A schematic enlarged view of the cross-section of an FD unit.

FIG. 26 is a schematic enlarged view of the cross-section of the FD unit 106. The FD unit 106 includes two floating diffusion areas of floating diffusion areas 321a and 321b, which have the same capacity. The floating diffusion area 321a is connected to the photodiode 101 via the transfer transistor 102, and the gate electrode of the amplification transistor 104. The floating diffusion area 321b is connected to the source electrode of the reset transistor 103.

Further, between the floating diffusion area 321a and the floating diffusion area 321b, a gate electrode 322 is formed. When a predetermined gate signal is applied to the gate electrode 322 and the gate electrode 322 is turned on, the floating diffusion area 321a and the floating diffusion area 321b are electrically connected to each other.

Then, in the case where the gate electrode is off when charges are transferred from the photodiode 101 to the FD unit 106, the charges are stored only in the floating diffusion area 321a as shown by diagonal lines in FIG. 26.

Figure 27:
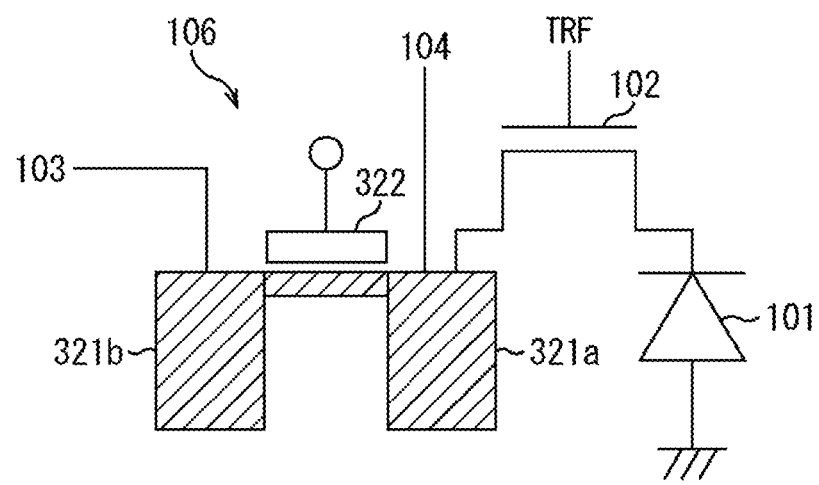
FIG. 27 A schematic enlarged view of the cross-section of an FD unit.

On the other hand, in the case where the gate electrode is on when charges are transferred from the photodiode 101 to the FD unit 106, the charges are stored in the floating diffusion areas 321a and 321a as shown by diagonal lines in FIG. 27. Therefore, the capacity of the FD unit 106 is doubled as compared with the case where the gate electrode 322 is off. On the other hand, because the capacity of the FD unit 106 is doubled, the conversion efficiency of the FD unit 106 is halved.

In this regard, the signal level control unit 213 turns on the gate electrode 322 when charges of the photodiode 101 of the W pixel are transferred, and turns off the gate electrode 322 when charges of the photodiode 101 of the RGB pixel are transferred. Accordingly, the conversion efficiency of the FD unit 106 of the W pixel is ½ times that of the RGB pixel. As a result, as described in FIG. 22, the signal level Vsig of the W pixel is shifted from VsigW1 to VsigW3, and the sensitivity difference between the W pixel and the RGB pixel can be corrected.

Note that although an example in which the capacities of the floating diffusion area 321a and the floating diffusion area 321b are the same has been shown in the above description, the ratio between the capacities of the floating diffusion area 321a and the floating diffusion area 321b is set depending on the W/G sensitivity ratio. For example, in the case where the W/G sensitivity ratio is 1.8×, the ratio between the capacities of the floating diffusion area 321a and the floating diffusion area 321b is set to 5:4.

Note that as described above with reference to FIG. 20, the W/G sensitivity difference is different for the type of a light source and the color temperature. In this regard, it may be possible to provide three or more floating diffusion areas and select the number or type of floating diffusion areas to be used when charges are transferred from the photodiode 101 to the FD unit 106 depending on the type of a light source or the color temperature. Accordingly, it is possible to adjust the conversion efficiency of the FD unit 106 of the W pixel depending on the W/G sensitivity ratio. Note that the FD unit 106 does not necessarily need to be a floating diffusion area, and may be a capacitive area in which charges can be stored, specifically, a so-called MOS (Metal-Oxide-Semiconductor) capacitor in which an insulator is sandwiched by electrodes, MIM (Metal-Insulator-Metal) capacitor, or a combination thereof.

Note that in the case where it is difficult to obtain information related to the light source or the color temperature, for example, it is desirable to set the conversion efficiency of the FD unit 106 of the W pixel on the basis of the W/G sensitivity ratio of the light source having the largest W/G sensitivity ratio among light sources that are assumed to be used.

<2. Modified Examples>

Hereinafter, modified examples of the above-mentioned embodiments of the present technology will be described.

{Modified Example Related to ADC}

As described above, in the first to third sensitivity difference correction methods, it needs to change the analog gain of the W pixel and the RGB pixel. Further, in the fourth sensitivity difference correction method, it needs to switch the switches SW1 to SWn for the W pixel and the RGB pixel to adjust the coupling ratio. Therefore, it needs time for settling of the ADC 23, and there is a risk that the processing is not performed on time.

Figure 28:
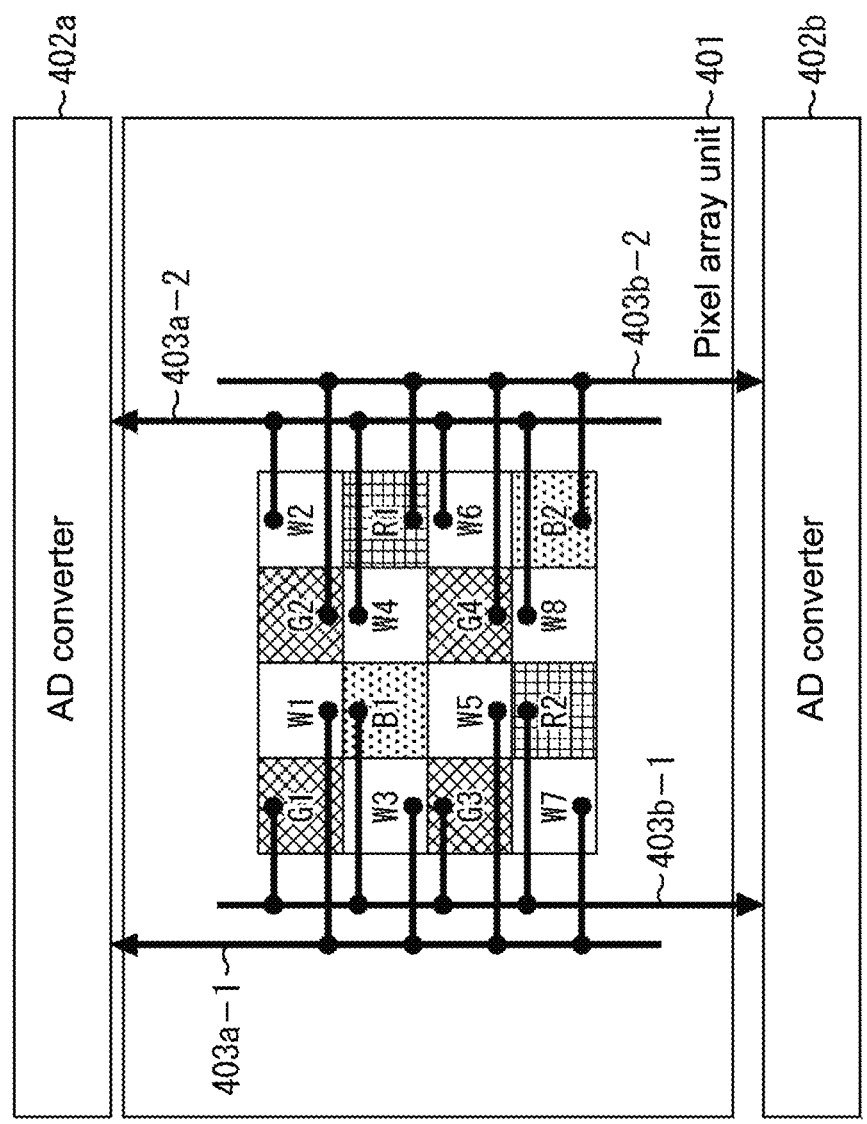
FIG. 28 A diagram showing a first modified example of the AD converter.

In this regard, for example, as shown in FIG. 28, it is desirable to divide the ADC into two for the W pixel and the RGB pixel. Specifically, in FIG. 28, a part of the unit pixel of a pixel array unit 401 is shown. W pixels W1 to W8 are connected to an AD converter 402a via a vertical signal line 403a-1 or 403a-2. Then, AD conversion of the W pixels W1 to W8 is performed by the AD converter 402a.

On the other hand, R pixels R1 and R2, G pixels G1 to G4, and B pixels B1 and B2 are connected to the AD converter 402b via a vertical signal line 403b-1 or 403b-2. Then, AD conversion of the R pixels R1 and R2, the G pixels G1 to G4, and the B pixels B1 and B2 is performed by the AD converter 402b.

By separating the AD converter for performing AD conversion of the W pixel and the AD converter for performing AD conversion of the RGB pixel as described above, it is possible to prevent the above-mentioned problem of settling from occurring.

Further, although an example in which a column-parallel AD conversion system is employed in the solid-state image sensor, as described above with reference to FIG. 1, has been shown in the above description, a pixel AD parallel conversion system may be employed.

Figure 29:
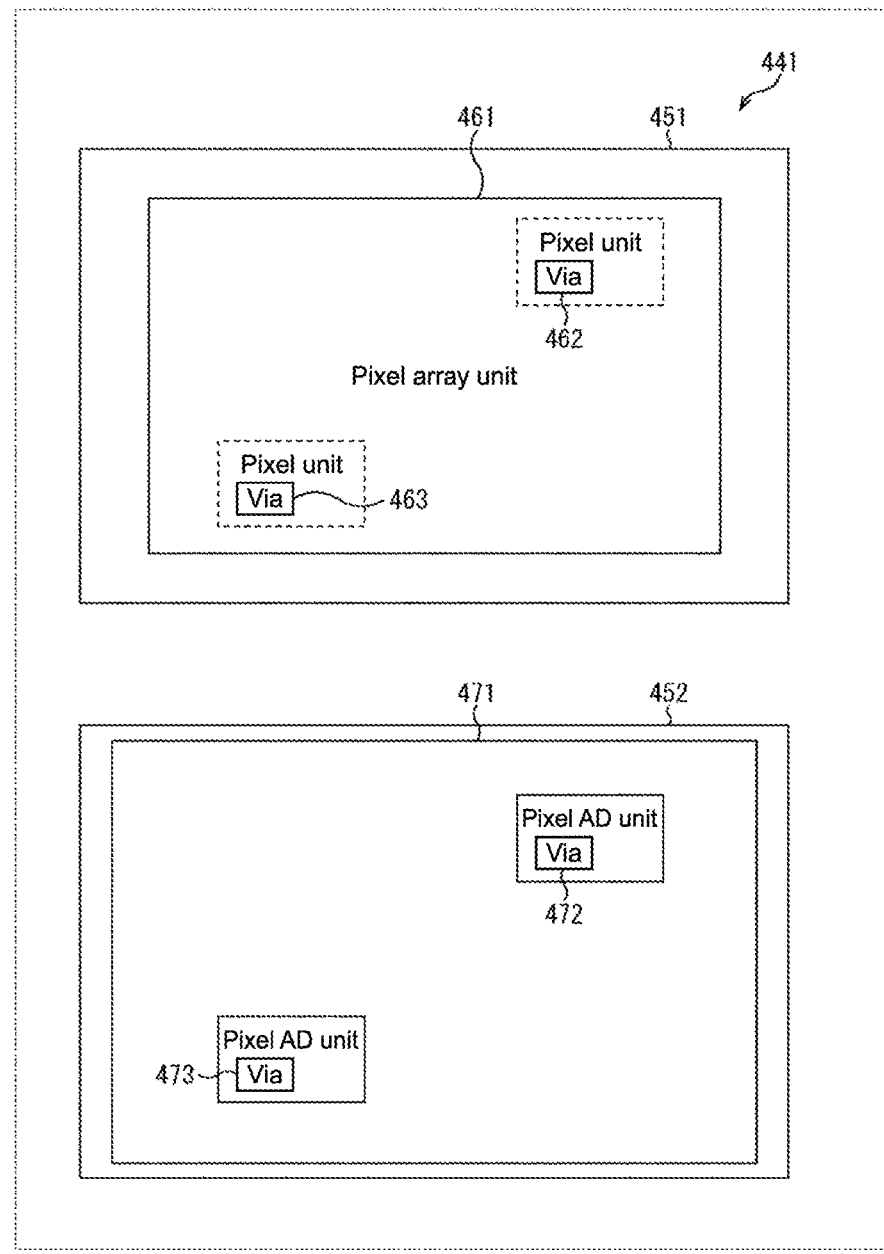
FIG. 29 A diagram showing second first modified example of the AD converter.

FIG. 29 schematically shows the configuration of a solid-state image sensor 441 in the case where a pixel AD conversion system is employed.

The solid-state image sensor 441 has a structure in which a pixel substrate 451 on which a pixel array unit 461 is formed and a logic substrate 452 on which a signal processing circuit 471 is formed are laminated.

Then, on the pixel array unit 461 of the pixel substrate 451, pixel units (groups), each of which has an area including arrangement of a predetermined number of two-dimensional pixels as one unit, are two-dimensionally arranged in a matrix pattern, and a via 462 is formed for each pixel unit. On the other hand, on the signal processing circuit 471, a circuit unit (pixel AD unit in the figure) including the AD converter 23 and the like is provided for each pixel unit of the pixel array unit 461. Further, for each pixel AD unit, a via 472 is formed corresponding to the pixel unit.

By employing the pixel parallel AD conversion system as described above, it is possible to increase the reading speed of the pixel signal. Therefore, the suspension period of the AD converter 23 can be prolonged. As a result, it is possible to reduce the power consumption.

{Modified Examples of Color Coding of Color Filter Array 12}

Hereinafter, with reference to FIG. 30 to FIG. 40, modified examples of color coding of the color filter array 12 will be described.

Figure 30:
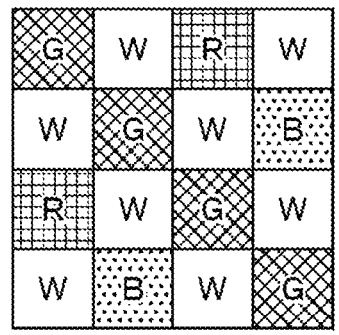
FIG. 30 A color arrangement diagram showing a first modified example of the color coding of the color filter array.

In FIG. 30, an example of color coding in which a pattern including four vertical pixels×four horizontal pixels is used as one unit is shown. In this example, similarly to the above-mentioned example of FIG. 3, the W filters, the R filters, the G filters, and the B filters are arranged in the ratio of 8:2:4:2. Specifically, the W filters are arranged in a checkered pattern. The R filters are arranged in the first row, third column and in the third row, first column. The B filters are arranged in the second row, fourth column and in the fourth row, second column. The G filters are diagonally arranged at the remaining pixel positions. This pattern of the color filters is repeatedly arranged in the vertical direction and horizontal direction on the color filter array 12.

Figure 31:
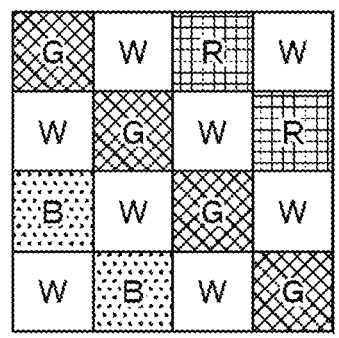
FIG. 31 A color arrangement diagram showing a second modified example of the color coding of the color filter array.

In FIG. 31, an example of color coding in which a pattern including four vertical pixels×four horizontal pixels is used as one unit is shown. In this example, similarly to the above-mentioned example of FIG. 3, the W filters, the R filters, the G filters, and the B filters are arranged in the ratio of 8:2:4:2. Specifically, the W filters are arranged in a checkered pattern. The R filters are arranged in the first row, third column and in the second row, fourth column. The B filters are arranged in the third row, first column and in the fourth row, second column. The G filters are diagonally arranged at the remaining pixel positions. This pattern of the color filters is repeatedly arranged in the vertical direction and horizontal direction on the color filter array 12.

Figure 32:
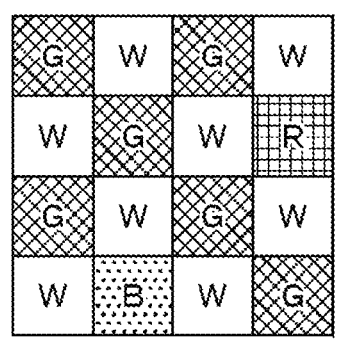
FIG. 32 A color arrangement diagram showing a third modified example of the color coding of the color filter array.

In FIG. 32, an example of color coding in which a pattern including four vertical pixels×four horizontal pixels is used as one unit is shown. In this example, the W filters, the R filters, the G filters, and the B filters are arranged in the ratio of 8:1:6:1. Specifically, the W filters are arranged in a checkered pattern. The R filter is arranged in the second row, fourth column. The B filter is arranged in the fourth row, second column. The G filters are arranged at the remaining pixel positions. This pattern of the color filters is repeatedly arranged in the vertical direction and horizontal direction on the color filter array 12.

Figure 33:
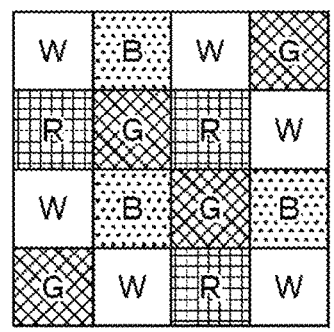
FIG. 33 A color arrangement diagram showing a fourth modified example of the color coding of the color filter array.

In FIG. 33, an example of color coding in which a pattern including four vertical pixels×four horizontal pixels is used as one unit is shown. In this example, the W filters, the R filters, the G filters, and the B filters are arranged in the ratio of 6:3:4:3. Specifically, the W filters are arranged in the first row, first column and third column, in the second row, fourth column, in the third row, first column, and in the fourth row, second column and fourth column. The R filters are arranged in the second row, first column and third column, and in the fourth row, third column. The G filters are arranged in the first row, fourth column, in the second row, second column, in the third row, third column, and in the fourth row, first column. The B filters are arranged in the first row, second column, and in the third row, second column and fourth column. This pattern of the color filters is repeatedly arranged in the vertical direction and horizontal direction on the color filter array 12.

Figure 34:
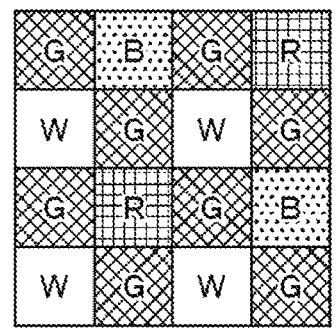
FIG. 34 A color arrangement diagram showing a fifth modified example of the color coding of the color filter array.

In FIG. 34, an example of color coding in which a pattern including four vertical pixels×four horizontal pixels is used as one unit is shown. In this example, the W filters, the R filters, the G filters, and the B filters are arranged in the ratio of 4:2:8:2. Specifically, the G filters are arranged in a checkered pattern. The R filters are arranged in the first row, fourth column and in the third row, second column. The B filters are arranged in the first row, second column and in the third row, fourth column. The W filters are arranged at the remaining pixel positions. This pattern of the color filters is repeatedly arranged in the vertical direction and horizontal direction on the color filter array 12.

Figure 35:
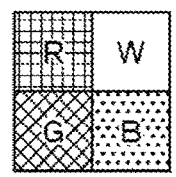
FIG. 35 A color arrangement diagram showing a sixth modified example of the color coding of the color filter array.

In FIG. 35, an example of color coding in which a pattern including two vertical pixels×two horizontal pixels is used as one unit is shown. In this example, the W filter, the R filter, the G filter, and the B filter are arranged in the ratio of 1:1:1:1. Specifically, the R filter and the W filter are arranged in the same row, and the G filter and the B filter are arranged in the same row. Further, the R filter and the G filter are arranged in the same column, and the W filter and the B filter are arranged in the same column. This pattern of the color filters is repeatedly arranged in the vertical direction and horizontal direction on the color filter array 12.

Note that the pattern of the color filter of FIG. 35 is only an example, and the arrangement of the color filters is not limited thereto as long as the W filter, the R filter, the G filter, and the B filter are arranged in the ratio of 1:1:1:1.

Figure 36:
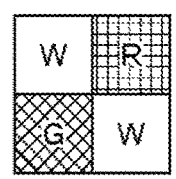
FIG. 36 A color arrangement diagram showing a seventh modified example of the color coding of the color filter array.

In FIG. 36, an example of color coding in which a pattern including two vertical pixels×two horizontal pixels is used as one unit is shown. In this example, the W filters, the G filter, and the R filter are arranged in the ratio of 2:1:1. That is, in this example, the B filter is not arranged. Specifically, the W filters are arranged in the oblique direction, and the G filter and the R filter are obliquely arranged. This pattern of the color filters is repeatedly arranged in the vertical direction and horizontal direction on the color filter array 12.

Figure 37:
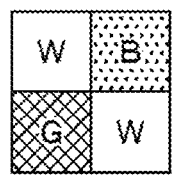
FIG. 37 A color arrangement diagram showing an eighth modified example of the color coding of the color filter array.

In FIG. 37, an example of color coding in which a pattern including two vertical pixels×two horizontal pixels is used as one unit is shown. In this example, the W filters, the G filter, and the B filter are arranged in the ratio of 2:1:1. That is, in this example, the R filter is not arranged. Specifically, the W filters are arranged in the oblique direction, and the G filter and the B filter are obliquely arranged. This pattern of the color filters is repeatedly arranged in the vertical direction and horizontal direction on the color filter array 12.

Figure 38:
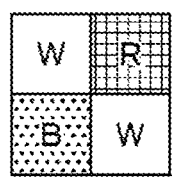
FIG. 38 A color arrangement diagram showing a ninth modified example of the color coding of the color filter array.

In FIG. 38, an example of color coding in which a pattern including two vertical pixels×two horizontal pixels is used as one unit is shown. In this example, the W filters, the R filter, and the B filter are arranged in the ratio of 2:1:1. That is, in this example, the G filter is not arranged. Specifically, the W filters are arranged in the oblique direction, and the R filter and the B filter are obliquely arranged. This pattern of the color filters is repeatedly arranged in the vertical direction and horizontal direction on the color filter array 12.

In the case of the example of FIG. 38, it is difficult to correct the sensitivity difference by using the W/G sensitivity ratio because there is no G pixel unlike the above-mentioned embodiments. In this regard, for example, the sensitivity difference may be corrected by using the sensitivity ratio between the W pixel and the R pixel having the second highest sensitivity instead of the W/G sensitivity ratio. Further, for example, the sensitivity of the G pixel may be calculated from the W pixel, the R pixel, and the B pixel, and the sensitivity difference may be corrected by using the ratio between the sensitivity of the W pixel and the calculated sensitivity of the G pixel.

Figure 39:
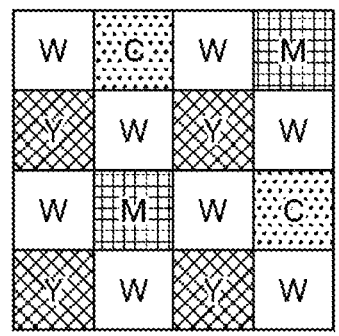
FIG. 39 A color arrangement diagram showing a tenth modified example of the color coding of the color filter array.

In FIG. 39, an example of color coding in which a pattern including four vertical pixels×four horizontal pixels is used as one unit is shown. In this example, the W filters, M (magenta) filters, Y (yellow) filters, and C (cyan) filters are arranged in the ratio of 8:2:4:2. Specifically, in the above-mentioned color coding in FIG. 3, the R filterers are replaced with M filters, G filters are replaced with Y filters, and the B filters are replaced with C filters.

In the case of the example of FIG. 39, it is difficult to correct the sensitivity difference by using the W/G sensitivity ratio because there is no G pixel unlike the above-mentioned embodiments. In this regard, for example, the sensitivity difference may be corrected by using the sensitivity ratio between the W pixel and the Y pixel having the second highest sensitivity instead of the W/G sensitivity ratio.

Figure 40:
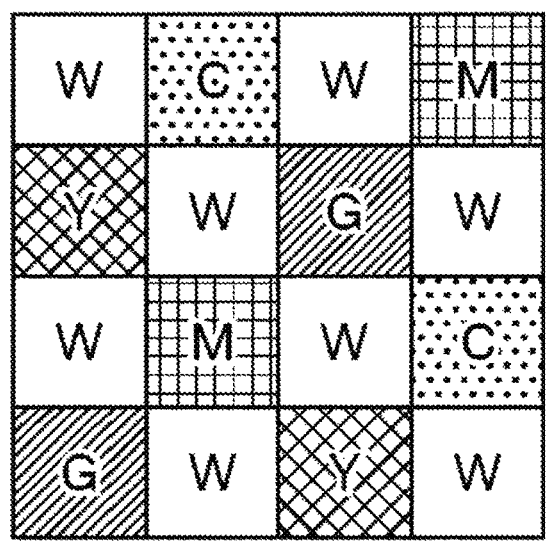
FIG. 40 A color arrangement diagram showing an eleventh modified example of the color coding of the color filter array.

In FIG. 40, an example of color coding in which a pattern including four vertical pixels×four horizontal pixels is used as one unit is shown. In this example, the W filters, the G filters, the M filters, the Y filters, and the C filters are arranged in the ratio of 8:2:2:2:2.

Note that in the above-mentioned examples of the pattern of the color filters in FIG. 30 to FIG. 35, the R filters may be replaced with the M filters, the G filters may be replaced with the Y filters, and the B filters may be replaced with the C filters.

Further, the pattern of the color filters in FIG. 3 and FIG. 30 to FIG. 40 may be horizontally inverted or vertically inverted for use.

Further, although an example in which the W pixel has the highest sensitivity has been shown in the above description, it is possible to correct the sensitivity difference by the same method as that described above also in the case where another pixel has the highest sensitivity.

Further, as necessary, it may be possible to use not only the sensitivity ratio between the pixel having the highest sensitivity and the pixel having the second highest sensitivity but also the sensitivity ratio between the pixel having the highest sensitivity and the pixel having the third highest sensitivity or lower to correct the sensitivity difference.

<3. Electronic Apparatus>

The solid-state image sensor to which the present technology is applied can be used as an imaging unit (image capturing unit) in a general electronic apparatus such as an imaging apparatus such as a digital still camera and a video camera, a portable terminal apparatus having an imaging function such as a mobile phone, and a copier that uses a solid-state image sensor as an image reading unit. Note that the above-mentioned module-like configuration mounted on an electronic apparatus, i.e., camera module, may be regarded as the imaging apparatus.

Figure 41:
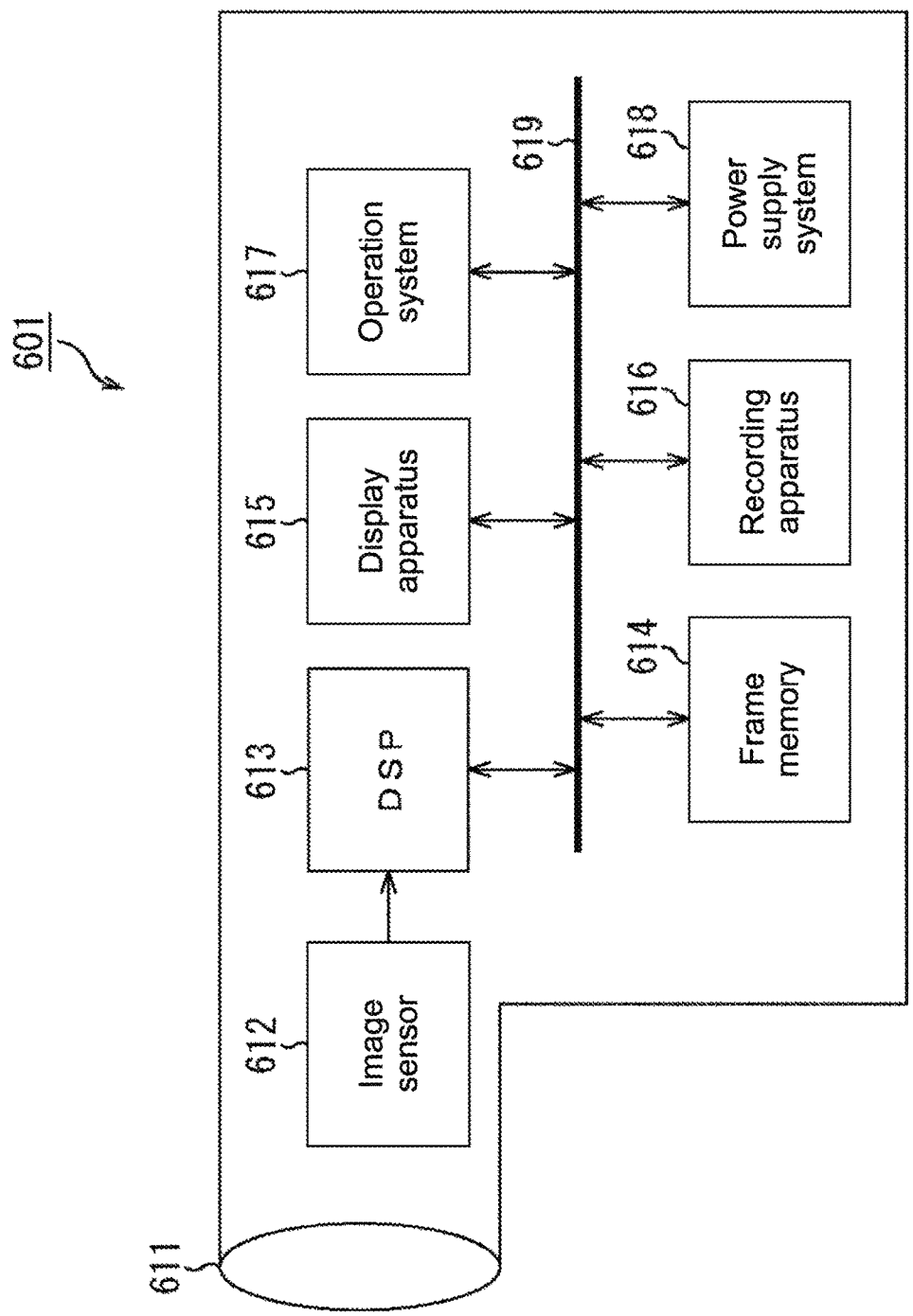
FIG. 41 A block diagram showing a configuration example of an electronic apparatus.

FIG. 41 is a block diagram showing a configuration example of an imaging apparatus (camera apparatus) 601 as an example of the electronic apparatus to which the present technology is applied.

As shown in FIG. 41, the imaging apparatus 601 includes an optical system including a lens group 611 and the like, an image sensor 612, a DSP circuit 613 as a camera signal processing unit, a frame memory 614, a display apparatus 615, a recording apparatus 616, an operation system 617, a power supply system 618, and the like. Then, the DSP circuit 613, the frame memory 614, the display apparatus 615, the recording apparatus 616, the operation system 617, and the power supply system 618 are connected to each other through a bus line 619.

The lens group 611 takes in incident light (image light) from an object and forms an image on the imaging surface of the image sensor 612. The image sensor 612 converts the amount of incident light formed on the imaging surface by the lens group 611 into an electric signal in units of pixels, and outputs it as a pixel signal.

The display apparatus 615 is formed of a panel type display apparatus such as a liquid crystal display apparatus and an organic EL (electro luminescence) display apparatus, and displays a moving image or a still image picked up by the image sensor 612. The recording apparatus 616 stores a moving image or a still image picked up by the image sensor 612 in a recording medium such as a memory card, a video tape, and a DVD (Digital Versatile Disk).

The operation system 617 issues an operation command for various functions of the imaging apparatus 601 under the operation performed by a user. The power supply system 618 appropriately supplies various kinds of power sources as operation power sources for the DSP circuit 613, the frame memory 614, the display apparatus 615, the recording apparatus 616, and the operation system 617.

Such imaging apparatus 601 is applied to a camera module for mobile apparatus such as a video camera, a digital still camera, a smartphone, and a mobile phone. Then, in the imaging apparatus 601, the solid-state image sensor according to each embodiment described above can be used as the image sensor 612. Accordingly, it is possible to improve the image quality of the imaging apparatus 601.

Note that embodiments of the present technology are not limited to the above-mentioned embodiments and various modifications can be made without departing from the essence of the present technology.

It should be noted that the present technology may take the following configurations.

(1)

A solid-state image sensor, including:

a pixel array unit including a plurality of pixels arranged, the plurality of pixels including a plurality of kinds of pixels, the plurality of kinds of pixels including a first pixel and a second pixel, the first pixel having the highest sensitivity, the second pixel having a sensitivity lower than the sensitivity of the first pixel; and a control unit that controls at least one of an analog gain and exposure time of/for the respective pixels depending on a ratio between the sensitivities of the first pixel and the second pixel.

(2)

The solid-state image sensor according to (1) above, in which the control unit corrects a difference between the sensitivities of the first pixel and the second pixel by generating a gain difference between a first analog gain of the first pixel and a second analog gain of the second pixel and providing a time difference between exposure time for the first pixel and exposure time for the second pixel when an amount of incident light has a value equal to or larger than a predetermined threshold value.

(3)

The solid-state image sensor according to (2) above, in which the control unit sets a minimum value of the second analog gain to a value higher than a minimum value of the first analog gain by a second offset value smaller than a first offset value corresponding to the sensitivity ratio, and makes the exposure time for the first pixel shorter than the exposure time for the second pixel depending on an amount corresponding to a difference between the gain difference and the first offset value when the gain difference is smaller than the first offset value.

(4)

The solid-state image sensor according to (3) above, in which the control unit adjusts the first offset value and the second offset value depending on a change in the sensitivity ratio caused due to a change in a light source or a color temperature.

(5)

The solid-state image sensor according to (3) or (4) above, in which the control unit sets the first analog gain to a value lower than the second analog gain by the first offset value when the amount of incident light is less than the threshold value.

(6)

The solid-state image sensor according to any one of (2) to (5) above, in which the control unit sets the first analog gain and the second analog gain with a slope of a reference signal used for AD conversion of a pixel signal of the first pixel and a pixel signal of the second pixel, and causes a dynamic range of a DA conversion unit that outputs the reference signal to match with a signal level when charges are stored in a photoelectric conversion element of the first pixel, the charges having the number of saturated electrons.

(7)

The solid-state image sensor according to any one of (1) to (6) above, in which
the control unit changes at least one of an analog gain and exposure time of/for the respective pixels depending on a change in the sensitivity ratio caused due to a change in a light source or a color temperature.

(8)

The solid-state image sensor according to any one of (1) to (7) above, in which
the first pixel is a white pixel, and
the second pixel is a pixel of a color different from that of the white pixel.

(9)

The solid-state image sensor according to (8) above, in which
the second pixel includes a red pixel and a blue pixel, and
the sensitivity ratio is a ratio of a sensitivity of the white pixel to a sensitivity of a green pixel calculated from the white pixel, the red pixel, and the blue pixel.

(10)

The solid-state image sensor according to any one of (1) to (9) above, in which
the first pixel is a pixel used for mainly a brightness signal, and
the second pixel is a pixel used for mainly a color signal.

(11)

The solid-state image sensor according to any one of (1) to (8) above, in which
the second pixel is a pixel having the second highest sensitivity.

(12)

An imaging control method, including:
controlling, by a solid-state image sensor including
a pixel array unit including a plurality of pixels arranged, the plurality of pixels including a plurality of kinds of pixels, the plurality of kinds of pixels including a first pixel and a second pixel, the first pixel having the highest sensitivity, the second pixel having a sensitivity lower than the sensitivity of the first pixel,
at least one of an analog gain and exposure time of/for the respective pixels depending on a ratio between the sensitivities of the first pixel and the second pixel.

(13)

An electronic apparatus, including:
a solid-state image sensor including
a pixel array unit including a plurality of pixels arranged, the plurality of pixels including a plurality of kinds of pixels, the plurality of kinds of pixels including a first pixel and a second pixel, the first pixel having the highest sensitivity, the second pixel having a sensitivity lower than the sensitivity of the first pixel, and
a control unit that controls at least one of an analog gain and exposure time of/for the respective pixels depending on a ratio between the sensitivities of the first pixel and the second pixel.

(14)

A solid-state image sensor, including:
a pixel array unit including a plurality of pixels arranged, the plurality of pixels including a plurality of kinds of pixels, the plurality of kinds of pixels including a first pixel and a second pixel, the first pixel having the highest sensitivity, the second pixel having a sensitivity lower than the sensitivity of the first pixel; and
a control unit that shifts potential of a pixel signal of the first pixel by an amount corresponding to a ratio between the sensitivities of the first pixel and the second pixel.

(15)

The solid-state image sensor according to (14) above, further including
an AD conversion unit that includes a comparator, the comparator including a first input terminal and a second input terminal, the pixel signal being input to the first input terminal, a reference signal being input to the second input terminal, the pixel signal being compared with the reference signal, the comparator comparing the pixel signal with the reference signal, in which
the control unit shifts the potential of the pixel signal by changing a coupling ratio on a side of the first input terminal.

(16)

The solid-state image sensor according to (15) above, further including:
a first capacitor connected to the first input terminal, a predetermined signal for eliminating a potential difference between the first input terminal and the second input terminal being input to the first capacitor; and
a second capacitor connected between a predetermined power supply and the first capacitor via a switch, in which
the control unit changes the coupling ratio by changing a state of the switch.

(17)

The solid-state image sensor according to (16) above, in which
the second capacitor includes a plurality of second capacitors and the switch includes a plurality of switches, each of the plurality of second capacitors being connected between the power supply and the first capacitor via the respective switches, and
the control unit changes the coupling ratio by individually changing a state of the respective switches.

(18)

The solid-state image sensor according to (14) above, in which
the control unit changes the potential of the pixel signal by changing conversion efficiency of a charge voltage conversion unit of the first pixel.

(19)

The solid-state image sensor according to (18) above, in which
the control unit changes the conversion efficiency of the charge voltage conversion unit by changing a capacity of the charge voltage conversion unit.

(20)

The solid-state image sensor according to any one of (14) to (19) above, in which
the control unit adjusts a shift amount of the potential of the pixel signal depending on a change in the sensitivity ratio caused due to a change in a light source or a color temperature.

(21)

The solid-state image sensor according to any one of (14) to (20) above, in which the first pixel is a white pixel, and the second pixel is a pixel of a color different from that of the white pixel.

(22)

The solid-state image sensor according to (21) above, in which the second pixel includes a red pixel and a blue pixel, and the sensitivity ratio is a ratio of a sensitivity of the white pixel to a sensitivity of a green pixel calculated from the white pixel, the red pixel, and the blue pixel.

(23)

The solid-state image sensor according to any one of (14) to (22) above, in which the first pixel is a pixel used for mainly a brightness signal, and the second pixel is a pixel used for mainly a color signal.

(24)

The solid-state image sensor according to any one of (14) to (21) above, in which the second pixel is a pixel having the second highest sensitivity.

(25)

A signal processing method, including:

shifting, by a solid-state image sensor including a pixel array unit including a plurality of pixels arranged, the plurality of pixels including a plurality of kinds of pixels, the plurality of kinds of pixels including a first pixel and a second pixel, the first pixel having the highest sensitivity, the second pixel having a sensitivity lower than the sensitivity of the first pixel, potential of the first pixel by an amount corresponding to a ratio between the sensitivities of the first pixel and the second pixel.

(26)

An electronic apparatus, including:

a solid-state image sensor including a pixel array unit including a plurality of pixels arranged, the plurality of pixels including a plurality of kinds of pixels, the plurality of kinds of pixels including a first pixel and a second pixel, the first pixel having the highest sensitivity, the second pixel having a sensitivity lower than the sensitivity of the first pixel, and a control unit that controls potential of the first pixel by an amount corresponding to a ratio between the sensitivities of the first pixel and the second pixel.

(27)

A solid-state image sensor, including:

a pixel array unit including a plurality of pixels arranged, the plurality of pixels including a plurality of kinds of pixels, the plurality of kinds of pixels including a first pixel and a second pixel, the first pixel having the highest sensitivity, the second pixel having a sensitivity lower than the sensitivity of the first pixel; and a control unit that controls an analog gain of the respective pixels depending on an amount of incident light, in which the control unit sets a first analog gain of the first pixel to a value lower than a second analog gain of the second pixel by a first offset value corresponding to a ratio between the sensitivities of the first pixel and the second pixel, and a dynamic range of the first analog gain to be in a range lower than a dynamic range of the second analog gain.

(28)

The solid-state image sensor according to (27) above, in which the control unit shifts the dynamic range of the first analog gain in a range lower than the dynamic range of the second analog gain when the analog gain of the second analog gain is less than a predetermined threshold value.

(29)

The solid-state image sensor according to (27) above, further including a DA conversion unit that outputs a reference signal used for AD conversion of a pixel signal of a pixel of the pixel array unit, in which the control unit controls the first analog gain and the second analog gain by controlling a slope of the reference signal, and sets the dynamic range of the first analog gain to be in a range lower than the dynamic range of the second analog gain by setting a reference current of the DA conversion unit for the first pixel to be larger than that for the second pixel, the reference current increasing and decreasing voltage of the reference signal.

(30)

The solid-state image sensor according to (29) above, in which the control unit changes a set value of the reference current in units of frames.

(31)

The solid-state image sensor according to (29) above, in which the control unit changes a set value of the reference current in units of pixels.

(32)

The solid-state image sensor according to any one of (27) to (31) above, in which the first pixel is a white pixel, and the second pixel is a pixel of a color different from that of the white pixel.

(33)

The solid-state image sensor according to (32) above, in which the second pixel includes a red pixel and a blue pixel, and the sensitivity ratio is a ratio of a sensitivity of the white pixel to a sensitivity of a green pixel calculated from the white pixel, the red pixel, and the blue pixel.

(34)

The solid-state image sensor according to any one of (27) to (33) above, in which the first pixel is a pixel used for mainly a brightness signal, and the second pixel is a pixel used for mainly a color signal.

(35)

The solid-state image sensor according to any one of (27) to (32) above, in which the second pixel is a pixel having the second highest sensitivity.

(36)

An imaging control method, including:

controlling, by a solid-state image sensor including a pixel array unit including a plurality of pixels arranged, the plurality of pixels including a plurality of kinds of pixels, the plurality of kinds of pixels including a first pixel and a second pixel, the first pixel having the highest sensitivity, the second pixel having a sensitivity lower than the sensitivity of the first pixel, an analog gain of the respective pixels depending on an amount of incident light; and setting a first analog gain of the first pixel to a value lower than a second analog gain of the second pixel by a first offset value corresponding to a ratio between the sensitivities of the first pixel and the second pixel, and a dynamic range of the first analog gain to be in a range lower than a dynamic range of the second analog gain.

(37)

An electronic apparatus, including:

a solid-state image sensor including a pixel array unit including a plurality of pixels arranged, the plurality of pixels including a plurality of kinds of pixels, the plurality of kinds of pixels including a first pixel and a second pixel, the first pixel having the highest sensitivity, the second pixel having a sensitivity lower than the sensitivity of the first pixel, and a control unit that controls an analog gain of the respective pixels depending on an amount of incident light, in which the control unit sets a first analog gain of the first pixel to a value lower than a second analog gain of the second pixel by a first offset value corresponding to a ratio between the sensitivities of the first pixel and the second pixel, and a dynamic range of the first analog gain to be in a range lower than a dynamic range of the second analog gain.

REFERENCE SIGNS LIST 1 solid-state image sensor, 11 semiconductor substrate, 21 pixel array unit, 22 row decoder, 23 AD converter, 24 column decoder, 27 control unit, 31 unit pixel, 41 DA converter, 42 comparing unit, 43 counting unit, 51 comparator, 61 counter, 62 latching unit, 101 photodiode, 102 transfer transistor, 103 reset transistor, 104 amplification transistor, 105 selection transistor, 106 FD unit, 151 analog signal output unit, 152 gain control signal generation unit, 153 counter decoder, 154 gain decoder, 161-1 to 161-n, 171-1 to 171-n basic current source cell, 201 sensitivity difference correction unit, 211 gain control unit, 212 exposure control unit, 213 signal level control unit, 301 gate electrode, 302 insulation film, 303 semiconductor substrate, 321a, 321b floating diffusion area, 322 gate electrode, 401 pixel array unit, 402a, 402b AD converter, 441 solid-state image sensor, 451 pixel substrate, 452 logic substrate, 461 pixel array unit, 462, 463 via, 471 signal processing circuit, 472, 473 via, 601 imaging apparatus, 612 image sensor, C1 to Cn, Caz1, Caz2, Cin1, Cin2 capacitor, SW1 to SWn switch, Tin1, Tin2 input terminal

The invention claimed is:

1. A solid-state image sensor, comprising:

a pixel array unit that includes:

a plurality of pixels, wherein the plurality of pixels comprise a first pixel and a second pixel, wherein a first sensitivity of the first pixel is highest among the plurality of pixels, and wherein the first pixel and the second pixel are of different type; and a control unit configured to:

control, at least one of an analog gain of each of the first pixel and the second pixel or an exposure time for each of the first pixel and the second pixel, based on a ratio of the first sensitivity of the first pixel and a second sensitivity of the second pixel; and correct, a first difference between the first sensitivity of the first pixel and the second sensitivity of the second pixel, based on the controlled at least one of the analog gain of each of the first pixel and the second pixel or the exposure time for each of the first pixel and the second pixel.

2. The solid-state image sensor according to claim 1, wherein the control unit is further configured to:

generate a gain difference between a first analog gain of the first pixel and a second analog gain of the second pixel;

determine, a time difference between a first exposure time for the first pixel and a second exposure time for the second pixel, based on an amount of incident light that is equal to or larger than a threshold value; and correct, the first difference between the first sensitivity of the first pixel and the second sensitivity of the second pixel, based on the gain difference and the time difference.

3. The solid-state image sensor according to claim 2, wherein the control unit is further configured to:

set a first minimum value of the second analog gain higher than a second minimum value of the first analog gain by a first offset value, wherein the first offset value is smaller than a second offset value, wherein the second offset value corresponds to the ratio of the first sensitivity of the first pixel and the second sensitivity of the second pixel; and set, a first exposure time for the first pixel shorter than a second exposure time for the second pixel, based on a second difference between the gain difference and the second offset value, wherein the gain difference is smaller than the second offset value.

4. The solid-state image sensor according to claim 3, wherein the control unit is further configured to:

change, the ratio of the first sensitivity of the first pixel and the second sensitivity of the second pixel, based on at least one of a type of light source or a color temperature of the incident light; and modify, the first offset value and the second offset value, based on the change in the ratio.

5. The solid-state image sensor according to claim 3, wherein the control unit is further configured to:

set, the first analog gain to a value lower than the second analog gain, based on the amount of incident light, wherein the amount of incident light is less than the threshold value, and wherein the first analog gain is lower than the second analog gain by the second offset value.

6. The solid-state image sensor according to claim 2, wherein the control unit is further configured to:

set the first analog gain and the second analog gain based on a slope of a reference signal, wherein the reference signal corresponds to AD conversion of a first pixel signal of the first pixel and a second pixel signal of the second pixel; and match a dynamic range of the reference signal with a signal level of at least one of the plurality of pixels such that the first pixel stores charges with a number of saturated electrons.

7. The solid-state image sensor according to claim 1, wherein the control unit is further configured to:

change, the ratio of the first sensitivity of the first pixel and the second sensitivity of the second pixel, based on a type of light source or a color temperature of incident light on the solid-state image sensor; and change the at least one of the analog gain of each of the first pixel and the second pixel or an exposure time for each of the first pixel and the second pixel, based on the change in the ratio.

8. The solid-state image sensor according to claim 1, wherein
the first pixel is a white pixel, and
the second pixel is of a color different from the white pixel.

9. The solid-state image sensor according to claim 8, wherein the control unit is further configured to:
calculate the second sensitivity of the second pixel based on the white pixel, a red pixel and a blue pixel,
wherein the second pixel includes the red pixel, a green pixel and the blue pixel, and
wherein a sensitivity ratio corresponds to the ratio of the first sensitivity of the white pixel to the second sensitivity of the green pixel.

10. The solid-state image sensor according to claim 1, wherein
the first pixel corresponds to a brightness signal, and
the second pixel corresponds to a color signal.

11. The solid-state image sensor according to claim 1, wherein the second sensitivity of the second pixel is second highest among the plurality of pixels.

12. An imaging control method, comprising:
in a solid-state image sensor including, a plurality of pixels,
wherein the plurality of pixels comprises a first pixel and a second pixel,
wherein a first sensitivity of the first pixel is highest among the plurality of pixels, and
wherein the first pixel and the second pixel are of different type;
controlling, by the solid-state image sensor, at least one of an analog gain of each of the first pixel and the second pixel or an exposure time for each of the first pixel and the second pixel, based on a ratio of the first sensitivity of the first pixel and a second sensitivity of the second pixel; and
correcting, by the solid-state image sensor, a difference between the first sensitivity of the first pixel and the second sensitivity of the second pixel, based on the controlled at least one of the analog gain of each of the first pixel and the second pixel or the exposure time for each of the first pixel and the second pixel.

13. An electronic apparatus, comprising:
a solid-state image sensor, comprising:
a pixel array unit that includes:
a plurality of pixels,
wherein the plurality of pixels comprise a first pixel and a second pixel,
wherein a first sensitivity of the first pixel is highest among the plurality of pixels, and
wherein the first pixel and the second pixel are of different type; and
a control unit configured to:
control, at least one of an analog gain of each of the first pixel and the second pixel or an exposure time for each of the first pixel and the second pixel, based on a ratio of the first sensitivity of the first pixel and a second sensitivity of the second pixel; and
correct, a first difference between the first sensitivity of the first pixel and the second sensitivity of the second pixel, based on the controlled at least one of the analog gain of each of the first pixel and the second pixel or the exposure time for each of the first pixel and the second pixel.

14. A solid-state image sensor, comprising:
a pixel array unit that includes:
a plurality of pixels,
wherein the plurality of pixels comprise a first pixel and a second pixel,
wherein a first sensitivity of the first pixel is highest among the plurality of pixels, and
wherein the first pixel and the second pixel are of different type; and
a control unit configured to:
shift, potential of a pixel signal of the first pixel by a first value, based on a ratio of the first sensitivity of the first pixel and a second sensitivity of the second pixel; and
correct, a difference between the first sensitivity of the first pixel and the second sensitivity of the second pixel, based on the shifted potential of the pixel signal of the first pixel.

15. The solid-state image sensor according to claim 14, further comprising a comparator that includes:
a first input terminal configured to receive the pixel signal as a first input; and
a second input terminal configured to receive a reference signal as a second input,
wherein the comparator is configured to compare the pixel signal with the reference signal, and
wherein the control unit is further configured to shift the potential of the pixel signal based on a change in a coupling ratio on a side of the first input terminal.

16. The solid-state image sensor according to claim 15, further comprising:
a first capacitor connected to the first input terminal and configured to eliminate a potential difference between the first input terminal and the second input terminal;
at least one second capacitor; and
at least one switch,
wherein the at least one second capacitor is between at least one power supply and the at least one switch,
wherein the at least one second capacitor is in connection with the first capacitor via the at least one switch,
wherein the control unit is further configured to change the coupling ratio based on a change in a state of the at least one switch.

17. The solid-state image sensor according to claim 14, wherein the control unit is further configured to change the potential of the pixel signal based on a change in conversion efficiency of a charge voltage conversion unit of the first pixel.

18. The solid-state image sensor according to claim 17, wherein the control unit is further configured to change the conversion efficiency of the charge voltage conversion unit based on a change in capacity of the charge voltage conversion unit.

19. The solid-state image sensor according to claim 14, wherein the control unit is further configured to:
change the ratio of the first sensitivity of the first pixel and the second sensitivity of the second pixel based on a type of light source or color temperature of incident light on the solid-state image sensor; and
modify the first value of the potential of the pixel signal based on the change in the ratio.

20. The solid-state image sensor according to claim 14, wherein
the first pixel is a white pixel, and
the second pixel is of a color different from the white pixel.

21. The solid-state image sensor according to claim 20, wherein the control unit is further configured to:
calculate the second sensitivity of the second pixel based on the white pixel, a red pixel and a blue pixel,
wherein the second pixel includes the red pixel, a green pixel and the blue pixel, and
wherein a sensitivity ratio corresponds to the ratio of the first sensitivity of the white pixel to the second sensitivity of the green pixel.

22. The solid-state image sensor according to claim 14, wherein
the first pixel corresponds to a brightness signal, and
the second pixel corresponds to a color signal.

23. The solid-state image sensor according to claim 14, wherein the second sensitivity of the second pixel is second highest among the plurality of pixels.

24. A signal processing method, comprising:
in a solid-state image sensor including, a plurality of pixels,
wherein the plurality of pixels comprise a first pixel and a second pixel,
wherein a first sensitivity of the first pixel is highest among the plurality of pixels, and
wherein the first pixel and the second pixel are of different type:
shifting by the solid-state image sensor, potential of a pixel signal of the first pixel by a first value, based on a ratio of the first sensitivity of the first pixel and a second sensitivity of the second pixel; and
correcting by the solid-state image sensor, a difference between the first sensitivity of the first pixel and the second sensitivity of the second pixel, based on the shifted potential of the pixel signal of the first pixel.

25. An electronic apparatus, comprising:
a solid-state image sensor, comprising:
a pixel array unit that includes:
a plurality of pixels,
wherein the plurality of pixels comprise a first pixel and a second pixel,
wherein a first sensitivity of the first pixel is highest among the plurality of pixels, and
wherein the first pixel and the second pixel are of different type; and
a control unit configured to:
control potential of a pixel signal of the first pixel by a first value, based on a ratio of the first sensitivity of the first pixel and a second sensitivity of the second pixel; and
correct a difference between the first sensitivity of the first pixel and the second sensitivity of the second pixel, based on the controlled potential of the pixel signal of the first pixel.

26. A solid-state image sensor, comprising:
a pixel array unit that includes:
a plurality of pixels,
wherein the plurality of pixels comprise a first pixel and a second pixel,
wherein a first sensitivity of the first pixel is highest among the plurality of pixels, and
wherein the first pixel and the second pixel are of different type; and
a control unit configured to:
control a first analog gain of the first pixel and a second analog gain of the second pixel based on an amount of incident light;
set the first analog gain of the first pixel as lower than the second analog gain of the second pixel by a first offset value,
wherein the first offset value corresponds to a ratio of the first sensitivity of the first pixel and a second sensitivity of the second pixel; and
set a first dynamic range of the first analog gain lower than a second dynamic range of the second analog gain.

27. The solid-state image sensor according to claim 26, wherein the control unit is further configured to:
compare the second analog gain of the second pixel and a threshold value; and
shift, based on the second analog gain of the second pixel that is lower than the threshold value, the first dynamic range of the first analog gain in a range lower than the second dynamic range of the second analog gain.

28. The solid-state image sensor according to claim 26, further comprising:
a DA conversion unit configured to output a reference signal, wherein the reference signal corresponds to AD conversion of a first pixel signal of the first pixel and a second pixel signal of the second pixel,
wherein the control unit is further configured to:
control a slope of the reference signal;
control the first analog gain and the second analog gain based on the controlled slope of the reference signal;
set a first reference current for the first pixel as larger than a second reference current for the second pixel; and
set the first dynamic range of the first analog gain as lower than the second dynamic range of the second analog gain, based on the set first reference current.

29. The solid-state image sensor according to claim 28, wherein the control unit is further configured to change a set value of the first reference current in units of frames.

30. The solid-state image sensor according to claim 28, wherein the control unit is further configured to change a set value of the first reference current in units of pixels.

31. The solid-state image sensor according to claim 26, wherein
the first pixel is a white pixel, and
the second pixel is of a color different from the white pixel.

32. The solid-state image sensor according to claim 31, wherein the control unit is further configured to:
calculate the second sensitivity of the second pixel based on the white pixel, a red pixel and a blue pixel,
wherein the second pixel includes the red pixel, a green pixel and the blue pixel, and
wherein a sensitivity ratio corresponds to the ratio of the first sensitivity of the white pixel to the second sensitivity of the green pixel.

33. The solid-state image sensor according to claim 26, wherein
the first pixel corresponds to a brightness signal, and
the second pixel corresponds to a color signal.

34. The solid-state image sensor according to claim 26, wherein the second sensitivity of the second pixel is second highest among the plurality of pixels.

35. An imaging control method, comprising:
in a solid-state image sensor including, a plurality of pixels,
wherein the plurality of pixels comprise a first pixel and a second pixel,
wherein a first sensitivity of the first pixel is highest among the plurality of pixels, and wherein the first pixel and the second pixel are of different type:
controlling, by the solid-state image sensor, a first analog gain of the first pixel based on an amount of incident light;
setting, by the solid-state image sensor, the first analog gain of the first pixel to a value lower than a second analog gain of the second pixel by a first offset value,
wherein the first offset value corresponds to a ratio of the first sensitivity of the first pixel and a second sensitivity of the second pixel, and
setting, by the solid-state image sensor, a first dynamic range of the first analog gain lower than a second dynamic range of the second analog gain.

36. An electronic apparatus, comprising:
a solid-state image sensor, comprising:
  a pixel array unit that includes:
    a plurality of pixels,
      wherein the plurality of pixels comprise a first pixel and a second pixel,
      wherein a first sensitivity of the first pixel is highest among the plurality of pixels, and
      wherein the first pixel and the second pixel are of different type; and
  a control unit configured to:
    control a first analog gain of the first pixel and a second analog gain of the second pixel based on an amount of incident light;
    set the first analog gain of the first pixel as lower than the second analog gain of the second pixel by a first offset value,
      wherein the first offset value corresponds to a ratio of the first sensitivity of the first pixel and a second sensitivity of the second pixel; and
    set a first dynamic range of the first analog gain lower than a second dynamic range of the second analog gain.

\* \* \* \* \*